United States Patent
Mizokuchi et al.

(10) Patent No.: US 7,663,182 B2
(45) Date of Patent: *Feb. 16, 2010

(54) VERTICAL TRENCH GATE TRANSISTOR SEMICONDUCTOR DEVICE AND METHOD FOR FABRICATING THE SAME

(75) Inventors: Shuji Mizokuchi, Kyoto (JP); Kazuaki Tsunoda, Tochigi (JP)

(73) Assignee: Panasonic Corporation, Osaka (JP)

( * ) Notice: Subject to any disclaimer, the term of this patent is extended or adjusted under 35 U.S.C. 154(b) by 394 days.

This patent is subject to a terminal disclaimer.

(21) Appl. No.: 11/297,406

(22) Filed: Dec. 9, 2005

(65) Prior Publication Data
US 2006/0124996 A1    Jun. 15, 2006

(30) Foreign Application Priority Data
Dec. 14, 2004    (JP) .............................. 2004-360997

(51) Int. Cl.
*H01L 29/76* (2006.01)
*H01L 29/94* (2006.01)
*H01L 31/62* (2006.01)
*H01L 31/113* (2006.01)
*H01L 31/119* (2006.01)

(52) U.S. Cl. ...................... 257/328; 257/331

(58) Field of Classification Search ......... 257/328–344, 257/E27.096, E27.55, E27.57, E27.58
See application file for complete search history.

(56) References Cited

U.S. PATENT DOCUMENTS

| 4,767,722 | A | 8/1988 | Blanchard |
| 5,034,785 | A | 7/1991 | Blanchard |
| 6,707,100 | B2 * | 3/2004 | Gajda ........................ 257/330 |
| 6,710,401 | B2 * | 3/2004 | Nakamura et al. .......... 257/330 |
| 7,187,041 | B2 * | 3/2007 | Mizokuchi et al. .......... 257/401 |

FOREIGN PATENT DOCUMENTS

| JP | 2662217 | 11/1987 |
| JP | 11-103052 | 4/1999 |
| JP | 2000-252468 | 9/2000 |
| JP | 2001-085685 | 3/2001 |

* cited by examiner

*Primary Examiner*—Cuong Q Nguyen
(74) *Attorney, Agent, or Firm*—McDermott Will & Emery LLP

(57) ABSTRACT

A first region functioning as a transistor includes a drain region, a body region formed over the drain region, a source region formed over the body region and a trench formed through the body region and having a gate electrode buried therein. A source region is formed over the body region extending in a second region. The source region forming an upper edge of the trench is rounded.

19 Claims, 15 Drawing Sheets

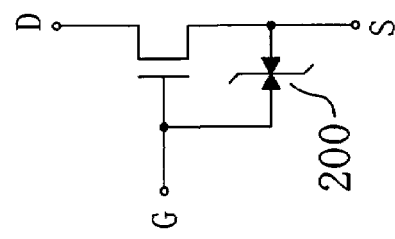
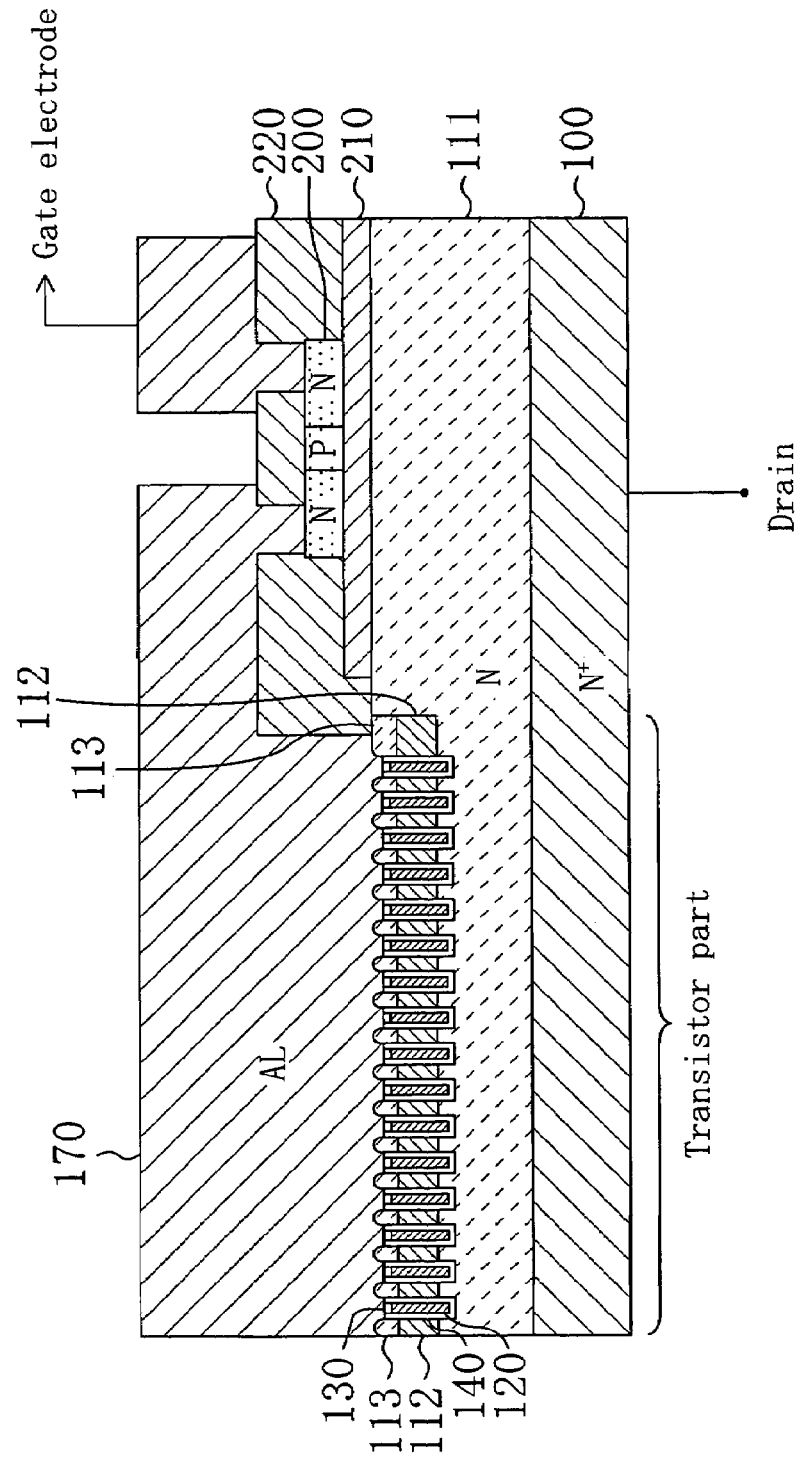

VERTICAL TRENCH GATE TRANSISTOR SEMICONDUCTOR DEVICE AND METHOD FOR FABRICATING THE SAME

CROSS REFERENCE TO RELATED APPLICATIONS

This Non-provisional application claims priority under 35 U.S.C. §119(a) on Patent Application No. 2004-360997 filed in Japan on Dec. 14, 2004, the entire contents of which are hereby incorporated by reference.

BACKGROUND OF THE INVENTION

The present invention relates to a semiconductor device having a vertical gate electrode and a method for fabricating the same.

In association with lowering in power consumption and increase in functionality and in speed of electronics equipment, lower power consumption or higher speed operation is demanded in semiconductor devices accompanied by such equipment. In order to satisfy such demands, low ON resistance of transistors is required in semiconductor devices generally used in DC-DC converters of electronics equipment. As one method for reducing the ON resistance of transistors, the density of the transistors arranged per unit area may be increased.

Specifically, a method is proposed in which a gate electrode of a semiconductor device is arranged vertically (along a direction perpendicular to the principal plane of the substrate). As a semiconductor device employing this method, there is vertical trench gate transistor semiconductor device. In the vertical semiconductor device, the gate electrode is a vertically arranged and the source region is formed so as to face the upper part of the gate electrode. Also, the drain region is formed so as to face the bottom part of the gate electrode.

In the vertical trench gate transistor semiconductor device, of which gate electrode is arranged vertically, the uppermost face of the vertical gate electrode and the surface of the silicon region where the source region is formed is almost on a level. Therefore, in order to prevent conduction between the vertical gate electrode and the source region or the body contact region, it is necessary to cover the upper part of the vertical gate electrode with, for example, a convex insulating film when the source region and the body contact region are connected to the common electrode.

As a prior art for solving this problem, there is proposed a technique disclosed in Japanese Patent Application Laid Open Publication No. 2000-252468A. In this reference, the above problem is solved in such a manner that in a plurality of vertical trench gate transistor semiconductor devices arranged in parallel with each other, the uppermost face of each gate electrode is concaved from the level of the surface of the silicon region where the source region is formed and an insulating film is filled in the concave part above the vertical gate electrode.

A conventional vertical trench gate transistor semiconductor device disclosed in Japanese Patent Application Laid Open Publication No. 2000-252468A or Japanese Patent Publication No. 2662217B will be described below with reference to drawings.

FIG. 1A is a view showing a structure in section of a conventional vertical trench gate transistor semiconductor device, specifically, a N-channel vertical gate DMOS (Double Diffused Metal Oxide Semiconductor) transistor.

As shown in FIG. 1A, an epitaxial layer 1810 is formed on a silicon substrate 1800, which is a $N^+$-type semiconductor substrate with a N-type (first conductivity type) impurity doped, by an epitaxial growth method. The epitaxial layer 1810 includes a N-type drain region 1811, a P-type body region 1812 formed on the drain region 1811, a $N^+$-type source region 1813 formed on the body region 1812, and a $P^+$-type body contact region 1814 which is formed adjacent to the source region 1813 and has an impurity concentration higher than that of the body region 1812. In the epitaxial layer 1810, a trench passing through the source region 1813 and the body region 1812 and extending to the upper part of the drain region 1811 is formed and a vertical gate electrode 1820 is buried in the trench. The level of the uppermost face of the vertical gate electrode 1820 is lower than the level of the surface of the epitaxial layer 1810 where the source region 1813 is formed. An insulating film 1830 is filled over the vertical gate electrode 1820 in the trench. Further, an insulating material 1840 serving as a gate insulating film intervenes between the vertical gate electrode 1820 and the respective faces of the drain region 1811 and the body region 1812 each serving as a vertical face of the trench. In addition, a common electrode 1850 to which the source region 1813 and the body contact region 1814 are commonly connected is formed on the epitaxial layer 1810.

FIG. 1B is a plan view showing a MOSFETs array in which cells are arranged in arrays, with the use of the MOSFET shown in FIG. 1A as one cell (one unit). Wherein, FIG. 1A is a section taken along a line A-A' of FIG. 1B. In addition, the members other than the vertical gate electrode 1820, the source region 1813, and the body contact region 1814 are not shown in FIG. 1B.

As described above, the epitaxial layer (semiconductor layer) 1810 of the conventional vertical trench gate transistor semiconductor device shown in FIGS. 1A and 1B includes the N-type drain region 1811, the P-type body region 1812 formed on the drain region 1811, and the $N^+$-type source region 1813 and the $P^+$-type body contact region 1814 which are formed on the body region 1812 so as to be adjacent with each other. Each surface of the source region 1813 and the body contact region 1814 serves as the surface of the semiconductor layer 1810. Further, the upper part of the vertical gate electrode 1820 faces the source region 1813 and the bottom part of the vertical gate electrode 1820 faces the drain region 1811.

In a vertical trench gate transistor semiconductor device having the above construction, the insulating film 1830 prevents conduction between the vertical gate electrode 1820 and the source region 1813 or the body contact region 1814. Accordingly, a step of covering the upper face of the vertical gate electrode 1820 with an insulating film, which has been performed when the source region 1813 and the body contact region 1814 are connected in common to the common electrode, can be omitted.

Moreover, since the uppermost face of the insulating film 1830 and the surface of the silicon region (semiconductor layer 1810) where the source region 1813 is formed are on a level, the subsequent masking step can be performed on a plane surface, thereby facilitating the fabrication of the vertical trench gate transistor semiconductor device.

FIGS. 2A and 2B are sections each showing a construction of another conventional vertical trench gate transistor semiconductor device, specifically, a N-channel vertical trench gate DMOS transistor disclosed in Japanese Patent Application Laid Open Publication No. 2000-252468A. Wherein, FIG. 2A is a section showing a first region functioning as a MOS transistor and FIG. 2B is a section showing a second region functioning as an electrical contact with the body region of the transistor.

As shown in FIG. 2A, in the first region, a N-type drain region 2811 is formed on a silicon substrate 2800, which is a N+-type semiconductor substrate with a N-type (first conductivity type) impurity doped. A P-type body region 2812 is formed on the drain region 2811 and a N+-type source region 2813 is formed on the body region 2812. Through the source region 2813 and the body region 2812, a trench extending to the upper part of the drain region 2811 is formed, and a vertical gate electrode 2820 is buried in the trench. The level of the uppermost face of the vertical gate electrode 2820 is lower than that of the surface of the semiconductor layer where the source region 2813 is formed. An insulating film 2830 is filled over the upper part of the vertical gate electrode 2820 in the trench. Also, an insulating material 2840 serving as a gate insulating film intervenes between the vertical gate electrode 2820 and the respective faces of the drain region 2811 and the body region 2812 each serving as a vertical wall face of the trench. In addition, a common electrode 2850 to be connected to the source region 2813 is formed on the source region 2813.

On the other hand, as shown in FIG. 2B, the second region has the same sectional construction as in the first region, except that a P+-type body contact region 2814 is formed in lieu to the source region 2813 shown in FIG. 2A.

FIG. 2C is a plan view showing the MOSFETs array in which the first region shown in FIG. 2A and the second region shown in FIG. 2B are alternately arranged in stripes along a direction along which the vertical gate electrode 2820, namely, the gate trench extends. Wherein, the members other than the vertical gate electrode 2820, the source region 2813, and the body contact region 2814 are not shown in FIG. 2C.

As shown in FIG. 2C, the source region 2813 and the body contact region 2814 are alternately arranged along the respective gate electrodes 2820 (i.e., gate trenches), so that the plural arrays in stripes are formed. The respective arrays are arranged adjacent to the respective gate trenches and are separated from one another by the respective gate trenches. Further, referring to the vertical dimension (dimension along which the gate trenches extend) in the arrays arranged beside the gate trenches, the source region 2813 has a relatively long dimension and the body contact region 2814 has a relatively short dimension, as shown in FIG. 2C. In other words, the first region functioning as a transistor has a larger area than that of the second region functioning as a body contact.

With the latter conventional vertical trench gate transistor semiconductor device having the striped layout shown in FIG. 2A through FIG. 2C, the intervals between the gate trenches can be set narrower than that in the conventional MOSFETs array having the cellular layout shown in FIGS. 1A and 1B.

In order to ensure the contact area between the source region and the electrode (common electrode) in such conventional MOSFETs array in the cellular layout, for example, Japanese Patent Application Laid Open Publication No. 2001-085685A or Japanese Patent Application Laid Open Publication No. 11-103052A discloses a technique of forming an insulating film over the gate electrode in the gate trench so that the level of the uppermost face of the insulating film is lower than the level of the surface of the semiconductor layer where the source region is formed. In this technique, the source region and the common electrode can be in contact partially with each other in the respective parts of the gate trench wall face and the surface of the semiconductor layer.

However, in such a conventional vertical trench gate transistor semiconductor device having the aforementioned cellular layout, the contact resistance of the source region increases in association with size reduction of the device for miniaturization. In detail, if a distance between the adjacent trench gate electrodes is narrowed in association with the size reduction of the vertical trench gate transistor semiconductor device, the source region is also narrowed accordingly. For example, in a vertical trench gate transistor semiconductor device in which vertical gates each having a width of 0.25 μm are arranged at intervals of 0.25 μm, if the intervals between the vertical gate electrodes are shortened 0.1 μm, the width of the vertical gate electrodes cannot be shortened when taking account of the resistance of polysilicon. Therefore, the intervals between the vertical gate electrodes must be narrowed to 0.15 μm necessarily, with a result of extremely small source region formed therebetween. Hence, the contact area between the common electrode and the source region becomes small, resulting in increased contact resistance of the source region.

It is noted that a smaller contact area between the common electrode and the body contact region increases the contact area between the common electrode and the source region because the layout area where the body contact region is arranged and the layout area where the source region is arranged are in a relationship of trade-off. However, such a smaller contact area between the common electrode and the body contact region leads to insufficient grounding of the body region and invites a parasitic bipolar transistor to operate.

On the other hand, in a conventional vertical trench gate transistor semiconductor device having the aforementioned striped layout, the intervals between adjacent trench gate electrodes are narrowed in association with size reduction of the device for miniaturization, and the source region is narrowed accordingly. In turn, the contact area between the common electrode and the source region becomes small, resulting in increased contact resistance of the source region.

SUMMARY OF THE INVENTION

The present invention has been made in view of the above problems and has its object of providing a vertical trench gate transistor semiconductor device that can be compacted without increasing the contact resistance of the source region and a fabricating method for it.

In order to attain the above object, a first vertical trench gate transistor semiconductor device according to the present invention includes: a drain region; a first body region formed over the drain region; a second body region formed over a part of the first body region; a first source region formed over another part of the first body region; a second source region formed over the second body region and electrically connected to the first source region; a trench formed through the first source region, the second source region, the first body region, and the second body region; and a gate disposed in the trench; wherein the second source region functions as an electrical contact for the first source region while the second body region functions as an electrical contact for the first body region, and an upper edge of a wall face of the trench is rounded. Wherein, the words "the upper edge of the wall face of the trench is rounded" can be the in the other words, "the upper edge of the trench is tapered as it goes deep."

In the first vertical trench gate transistor semiconductor device, the second source region is formed over the second body region. Accordingly, the contact area between the common electrode and the source region can be ensured sufficiently without reducing the layout area of the body contact region even if the distance between the gates is shortened in association with size reduction of the device. Hence, a compacted vertical trench gate transistor semiconductor device can be attained with no increase in contact resistance of the source region.

Further, the rounded upper edge of the wall face of the trench prevents void from being formed in formation of a conductive film or the like in contact with the upper edge of the wall face of the trench. The step coverage of the upper edge of the wall face of the trench and the conductive film or the like formed thereon can be improved, attaining reduction in contact resistance and ON resistance. In addition, stress concentration on the upper edge can be mitigated compared with a case with a square-cornered upper edge of the wall face of the trench, resulting in suppression of a leak current.

In the first vertical trench gate transistor semiconductor device, it is possible that the first source region and the second source region are exposed at the upper edge of the wall face of the trench and the first source region and the second source region which are exposed at the upper edge of the wall face of the trench are rounded. In this case, the contact resistance between the first and second source regions exposed at the upper edge of the wall face of the trench and the conductive film or the like formed thereon can be reduced.

In the first vertical trench gate transistor semiconductor device, parts of the wall face of the trench from the upper edge to upper faces of the first source region and the second source region may be rounded entirely. Namely, when the upper edge of the wall face of the trench is rounded in the vertical trench gate transistor semiconductor device having short trench intervals, the entirety of the upper face of the semiconductor layer between two trenches is rounded.

In the first vertical trench gate transistor semiconductor device, it is preferable to set a thickness of the second source region smaller than a thickness of the first source region.

This ensures electrical contact with the source region and the body region through the wall of the trench even in the case where the depths of the trenches are uniform.

In the first vertical trench gate transistor semiconductor device, the second source region preferably covers an entirety of the second body region.

With this structure, formation of the gate so as to form the recessed part in the upper part of the trench ensures electrical contact with the source region through the wall of the trench.

In the first vertical trench gate transistor semiconductor device, an impurity concentration of an upper part of the second body region is preferably higher than an impurity concentration of a lower part of the second body region.

This ensures electrical contact with the second body region.

In the first vertical trench gate transistor semiconductor device, it is preferable that a gate region is formed so as to form a recessed part in an upper part of the trench and the second body region is exposed at a wall face of the recessed part.

This ensures electrical contact with the first source region and the second source region while the second body region is in electrical contact commonly with the first source region and the second source region, resulting in a narrowed gate pitch to contemplate reduction in size of the devices.

In the first vertical trench gate transistor semiconductor device, it is preferable that a gate region is formed so as to form a recessed part in an upper part of the trench and the first source region and the second source region are exposed at the wall face of the recessed part and are in contact through the respective exposed parts and upper faces of the respective source regions.

This further increases the contact area between the common electrode and the source region, resulting in further reduction in contact resistance of the source region.

In the case where the second region is exposed at the wall face of the recessed part in the upper part of the trench and is in electrical contact through the exposed part, it is possible that the second body region includes, in an upper portion thereof, a heavily doped region of which impurity concentration is relatively high and the heavily doped region is exposed at the wall face of the recessed part and is in electrical contact through the exposed part. Or, the second source region and the second body region may be exposed at the wall face of the recessed part and be in electrical contact through the respective exposed parts. Alternatively, an additional electrode overlaid from the second source region to the gate region may be provided with an insulating film interposed, wherein the additional electrode is in contact with the second source region and the second body region at the wall face of the recessed part.

A second vertical trench gate transistor semiconductor device according to the present invention includes: a drain region; a first body region formed over the drain region; a second body region formed over a part of the first body region; a first source region formed over another part of the first body region; a second source region formed over the second body region and electrically connected to the first source region; a trench formed through the first source region and the first body region; and a gate disposed in the trench, wherein the second source region functions as an electrical contact for the first source region while the second body region functions as an electrical contact for the first body region, an upper edge of a wall face of the trench is rounded, a gate region is formed so as to form a recessed part in an upper part of the trench, and the second body region is exposed at a wall face of the recessed part and is in electrical contact through the exposed part.

In the second vertical trench gate transistor semiconductor device, the second body region is in electrical contact through the wall face of the recessed part above the gate in the trench, ensuring the contact area between the common electrode and the body region. Accordingly, voltage difference in the body region in operation of the transistor can be suppressed, preventing a parasitic bipolar transistor from operating.

Further, the rounded upper edge of the wall of the trench prevents void from being formed in formation of a conductive film or the like in contact with the upper edge of the wall face of the trench. The step coverage of the upper edge of the wall face of the trench and the conductive film or the like formed thereon can be improved, attaining reduction in contact resistance and ON resistance. In addition, stress concentration on the upper edge can be mitigated compared with a case with a square-cornered upper edge of the wall face of the trench, resulting in suppression of a leak current.

In the second vertical trench gate transistor semiconductor device, it is possible that the first source region and the second source region are exposed at the upper edge of the wall face of the trench and the first source region and the second source region which are exposed at the upper edge of the wall face of the trench are rounded. In this case, the contact resistance between the first and second source regions exposed at the upper edge the wall face of the trench and the conductive film or the like formed thereon can be reduced.

In the second vertical trench gate transistor semiconductor device, parts of the wall face of the trench from the upper edge to upper faces of the first source region and the second source region may be rounded entirely. Namely, when the upper edge of the wall of the trench is rounded in the vertical trench gate transistor semiconductor device having short trench intervals, the entirety of the upper face of the semiconductor layer between two trenches is rounded.

In the second vertical trench gate transistor semiconductor device, it is preferable to include an additional electrode overlaid from the first source region and the second source region to the gate region with an insulating film interposed, wherein the additional electrode is in contact with the second source region and the second body region at the wall face of the recessed part.

With the above construction, the second source region and the second body region are commonly connected to the electrode surely. Specifically, both the first source region and the second source region can be in electrical contact with the source region, narrowing the gate pitch to contemplate further reduction in size of the device.

Further, in this case, it is preferable that the additional electrode is electrically connected to the first source region and the second source region. In this case, the source region can be in electrical contact with both the first source region and the second source region.

In the second vertical trench gate transistor semiconductor device, it is preferable that the second source region is thinner than the first source region.

This ensures electrical contact with the source region and the body region even in the case where the depths of the trenches are uniform.

In the second vertical trench gate transistor semiconductor device, it is preferable that the second body region includes a lower portion and an upper portion whose impurity concentration is higher than an impurity concentration of the lower portion and the upper portion is exposed at the wall face of the recessed part and is in electrical contact through the exposed part.

This further ensures electrical contact with the body region. In this case, also, it is possible that an additional electrode is formed over the gate in the recessed part with an insulating layer interposed and the additional electrode is in contact with the upper portion at the wall face of the recessed part.

A first vertical trench gate transistor semiconductor device fabrication method according to the present invention directs to a method for fabricating a vertical trench gate transistor semiconductor device having a first portion functioning as a transistor and a second portion functioning as an electrical contact with a body region of the transistor and arranged adjacent to the first portion, including: a first step of forming a first drain region in the first portion and a second drain region in the second portion, and forming a first body region over the first drain region and a second body region over the second drain region; a second step of forming a trench in the first body region and the second body region; a third step of forming a first source region over the first body region; a fourth step of forming a second source region over the second body region; a fifth step of forming a gate within the trench so as to form a recessed part in an upper part of the trench after the second step; a sixth step of forming an insulating film for burying the recessed part after the fifth step; and a seventh step of removing an upper part of the insulating film and rounding an upper edge of a wall face of the recessed part, wherein the first source region and the second source region are formed so as to be electrically connected with each other.

In the first vertical trench gate transistor semiconductor device fabrication method, the second source region is formed over the second body region of the second portion functioning as an electrical contact with the body region. Accordingly, the contact area between the common electrode and the source region can be ensured sufficiently without reducing the layout area of the body contact region even if the distance between the gates is shortened in association with size reduction of the device. Hence, a compacted vertical trench gate transistor semiconductor device can be attained with no increase in contact resistance of the source region.

Further, in the first vertical trench gate transistor semiconductor device fabrication method, each source region is formed (the third and fourth steps) after the trench formation (the second step), moderating thermal treatment after the formation of the source regions. This enables control of impurity diffusion in the source regions, attaining reliable control of the device dimension.

Also, the rounding of the upper edge of the wall face of the recessed part in the seventh step prevents void from being formed in formation of a conductive film or the like in contact with the upper edge of the wall face of the trench in the following step. The step coverage of the upper edge of the wall face of the trench and the conductive film or the like formed thereon can be improved, attaining reduction in contact resistance and ON resistance. In addition, stress concentration on the upper edge can be mitigated compared with a case with a square-cornered upper edge of the wall face of the trench, resulting in suppression of a leak current.

In the first vertical trench gate transistor semiconductor device fabrication method, the upper part of the insulating film may be removed and the upper edge of the wall face of the recessed par may be rounded by dry etching in the seventh step.

In the first vertical trench gate transistor semiconductor device fabrication method, in the seventh step, the dry etching may be performed under a condition that a selection ratio of the insulating film to a material exposed at the wall face of the recessed part is in a range between 2 and 5, both inclusive. In this case, the upper edge of the wall face of the recessed part can be rounded reliably.

In the first vertical trench gate transistor semiconductor device fabrication method, the fourth step preferably includes a step of simultaneously introducing an impurity into respective parts to be the first source region and the second source region in the first portion.

This enables introduction of an impurity to the semiconductor region by, for example, ion implantation to the entirety of the semiconductor region in the formation of the second source region. As a result, the second source region can be formed with no additional lithography step carried out.

In the first vertical trench gate transistor semiconductor device fabrication method, it is preferable to form the second source region so as to cover an entirety of the second body region.

With the above structure, formation of the gate so as to form the recessed part in the upper part of the trench leads to electrical contact with the source region through the wall face of the recessed part in both the first portion and the second portion.

The first vertical trench gate transistor semiconductor device fabrication method preferably includes an eighth step of forming a heavily-doped region over the second body region, wherein in the eighth step, an impurity concentration of an upper part of the second body region is set higher than an impurity concentration of a lower part of the second body region.

This further ensures electrical contact with the body region.

The first vertical trench gate transistor semiconductor device fabrication method preferably includes a step of forming, on the insulating film, an additional electrode electrically connected to the second body region after the seventh step.

This leads to electrical contact with the source region of both the first portion and the second portion and also leads to electrical contact with the body region of the second portion in common to the source region, resulting in a narrowed gate pitch to reduce the size of the devices.

The first vertical trench gate transistor semiconductor device fabrication method preferably includes a step of forming, on the insulating film, an additional electrode electrically connected to the second source region after the seventh step.

This increases the contact area between the common electrode (the additional electrode) and the source region, resulting in further reduction in contact resistance of the source region.

In the first vertical trench gate transistor semiconductor fabrication method, it is preferable that the second body region and the second source region are exposed at the wall face of the recessed part in the fifth step and the method further includes the step of forming, on the insulating film, an additional electrode electrically connected to the second body region and the second source region after the seventh step.

This ensures electrical contact with the source region of the first portion and the second portion, and leads to electrical contact with the body region of the second portion in common to the source region, resulting in a narrowed gate pitch to contemplate reduction in size of the devices. Further, the contact area between the common electrode (the additional electrode) and the source region further increases, resulting in further reduction in contact resistance of the source region.

A second vertical trench gate transistor semiconductor device fabrication method according to the present invention directs to a method for fabricating a vertical trench gate transistor semiconductor having a first portion functioning as a transistor and a second portion functioning as an electrical contact with a body region of the transistor and arranged adjacent to the first portion, includes: a first step of forming a first drain region in the first portion and a second drain region in the second portion, and forming a first body region over the first drain region and a second body region over the second drain region; a second step of forming a trench in the first body region and the second body region; a third step of forming a gate in the trench so as to form a recessed part in an upper part of the trench and so as to expose the second body region at a wall face of the recessed part; a fourth step of forming, in the recessed part, an additional electrode electrically connected to the second body region; a fifth step of forming a gate in the trench so as to form a recessed part in an upper part of the trench after the second step; a sixth step of forming an insulating film for burying the recessed part after the fifth step; and a seventh step of removing an upper part of the insulating film and rounding an upper edge of a wall face of the recessed part after the sixth step.

According to the second vertical trench gate transistor semiconductor device fabrication method, the body region of the second portion can be in electrical contact through the wall face of the recessed part above the gate in the trench, ensuring the contact area between the common electrode (the additional electrode) and the body region. Hence, voltage difference in the body region in operation of the transistor can be suppressed, preventing a parasitic bipolar transistor from operating.

In the second vertical trench gate transistor semiconductor device fabrication method, the upper part of the insulating film may be removed and the upper edge of the wall face of the recessed part may be rounded by dry etching in the seventh step.

In the second vertical trench gate transistor semiconductor device fabrication method, it is preferable to perform, in the seventh step, the dry etching under a condition that a selection ratio of the insulating film to a material exposed at the wall face of the recessed part is in a range between 2 and 5, both inclusive.

The second vertical trench gate transistor semiconductor device fabrication method preferably includes an eighth step of forming a heavily-doped region over the second body region, wherein in the eighth step, an impurity concentration of an upper part of the second body region is set higher than an impurity concentration of a lower part of the second body region.

This further ensures electrical contact with the body region. In this case, the upper part is exposed at the wall of the recessed part.

It is preferable that the trench has a width of 0.3 µm or less and the trench has an aspect ratio of 3 or more.

Further, the number of the trenches may be 400 or more.

A third vertical trench gate transistor semiconductor device according to the present invention includes: a first conductivity type first semiconductor layer serving as a drain region; a second conductivity type second semiconductor layer formed over the first semiconductor layer and serving as a body region; a first conductivity type third semiconductor layer formed over the second semiconductor layer and serving as a source region; a trench formed through the second semiconductor layer and the third semiconductor layer; a gate formed in the trench; and an electrode formed over the third semiconductor layer, wherein a second conductivity type fourth semiconductor layer which does not reach a surface of the third semiconductor layer and is exposed at a wall face of the trench is formed in a part of the third semiconductor layer formed along a direction along which the gate extends, the fourth semiconductor layer is electrically isolated from the gate and is electrically connected to the electrode at an upper part of the trench, and an upper edge of the wall face of the trench is rounded.

In the third vertical trench gate transistor semiconductor device, the second conductivity type fourth semiconductor layer (the second body region) is formed in a part of the first conductivity type third semiconductor layer. Accordingly, the contact area between the common electrode and the source region can be ensured sufficiently without reducing the layout area of the body contact region even if the distance between the gates is shortened in association with size reduction of the device. Hence, a compacted vertical trench gate transistor semiconductor device can be attained with no increase in contact resistance of the source region.

Further, the rounded upper edge of the wall face of the trench prevents void from being formed in formation of a conductive film or the like in contact with the upper edge of the wall face of the trench. The step coverage of the upper edge of the wall face of the trench and the conductive film or the like formed thereon can be improved, attaining reduction in contact resistance and ON resistance. In addition, stress concentration on the upper edge can be mitigated compared with a case with a square-cornered upper edge of the wall face of the trench, resulting in suppression of a leak current.

A fourth vertical trench gate transistor semiconductor device according to the present invention includes: a first conductivity type first semiconductor layer serving as a drain region; a second conductivity type second semiconductor layer formed over the first semiconductor layer and serving as a body region; a first conductivity type third semiconductor layer formed over the second semiconductor layer and serving as a source region; a trench formed through the second semiconductor layer and the third semiconductor layer; a gate formed in the trench; an insulating film formed on the gate in the trench; and an electrode formed on the third semiconductor layer and the insulating film, wherein a second conductivity type fourth semiconductor layer which does not reach a surface of the third semiconductor layer and is exposed at a wall face of the trench is formed in a part of the third semiconductor layer formed along a direction along which the gate extends, the fourth semiconductor layer is electrically connected to the electrode at an upper part of the trench, and an upper edge of the wall face of the trench is rounded.

In the fourth vertical trench gate transistor semiconductor device, the second conductivity type fourth semiconductor layer (the second body region) is formed in a part of the first conductivity type third semiconductor layer. Accordingly, the contact area between the common electrode and the source region can be ensured sufficiently without reducing the layout area of the body contact region even if the distance between the gates is shortened in association with size reduction of the device. Hence, a compacted vertical trench gate transistor semiconductor device can be attained with no increase in contact resistance with the third region.

Further, the rounded upper edge of the wall face of the trench prevents void from being formed in formation of a conductive film or the like on the upper edge of the wall face of the trench. The step coverage of the upper edge of the wall face of the trench and the conductive film or the like formed thereon can be improved, attaining reduction in contact resistance and ON resistance. In addition, stress concentration on the upper edge can be mitigated compared with a case with a square-cornered upper edge of the wall face of the trench, resulting in suppression of a leak current.

In the third and fourth vertical trench gate transistor semiconductor devices, it is possible that the third semiconductor layer is exposed at the upper edge of the wall face of the trench and the third semiconductor layer exposed at the upper edge of the wall face of the trench is rounded. In this case, the contact resistance between the third semiconductor layer, which is exposed at the upper edge of the wall of the trench, and the conductive film formed thereon can be reduced.

In the third and fourth vertical trench gate transistor semiconductor devices, a part of the wall face of the trench from the upper edge to an upper face of the third semiconductor layer may be rounded entirely. Namely, when the upper edge of the wall face of the trench is rounded in the vertical trench gate transistor semiconductor device having short trench intervals, the entirety of the upper face of the semiconductor layer between two trenches is rounded.

In the third and fourth vertical trench gate transistor semiconductor devices, the fourth semiconductor layer may be formed periodically in the third semiconductor layer along a direction along which the trench extends.

In the third and fourth vertical trench gate transistor semiconductor devices, it is possible that the trench is formed in plural parts, a width of each of the trenches is set to 0.3 µm or less, and intervals between the plural trenches are set to 0.3 µm or less.

In the third and fourth vertical trench gate transistor semiconductor devices, each of the trenches may have an aspect ratio of 3 or more.

BRIEF DESCRIPTION OF THE DRAWINGS

The accompanying drawings, which are incorporated in and form part of the specification, together with the description serve to explain the principles of the invention. In the drawings:

FIG. 7A through FIG. 7F are sections respectively showing steps of a vertical trench gate transistor semiconductor device fabricating method according to the first embodiment of the present invention, wherein FIGS. 7A, 7C and 7E show states in which the first region functioning as a transistor is formed and FIGS. 7B, 7D and 7F show states in which the second region for electrical contact with the body region of the transistor is formed.

FIG. 8A through FIG. 8F are sections respectively showing steps of the vertical trench gate transistor semiconductor device fabricating method according to the first embodiment of the present invention, wherein FIGS. 8A, 8C and 8E show states in which the first region functioning as a transistor is formed and FIGS. 8B, 8D and 8F show states in which the second region for electrical contact with the body region of the transistor is formed.

FIG. 9A through FIG. 9F are sections respectively showing steps of the vertical trench gate transistor semiconductor device fabricating method according to the first embodiment of the present invention, wherein FIGS. 9A, 9C and 9E show states in which the first region functioning as a transistor is formed and FIGS. 9B, 9D and 9F show states in which the second region for electrical contact with the body region of the transistor is formed.

FIG. 10A through FIG. 10F are sections respectively showing steps of the vertical trench gate transistor semiconductor device fabricating method according to the first embodiment of the present invention, wherein FIGS. 10A, 10C and 10E show states in which the first region functioning as a transistor is formed and FIGS. 10B, 10D and 10F show states in which the second region for electrical contact with the body region of the transistor is formed.

FIG. 11A through FIG. 11F are sections respectively showing steps of the vertical trench gate transistor semiconductor device fabricating method according to the first embodiment of the present invention, wherein FIGS. 11A, 11C and 11E show states in which the first region functioning as a transistor is formed and FIGS. 11B, 11D and 11F show states in which the second region for electrical contact with the body region of the transistor is formed.

FIG. 12A through FIG. 12F are sections respectively showing steps of a vertical trench gate transistor semiconductor device fabricating method according to a second embodiment of the present invention, wherein FIGS. 12A, 12C and 12E show states in which the first region functioning as a transistor is formed and FIGS. 12B, 12D and 12F show states in which the second region for electrical contact with the body region of the transistor is formed.

FIGS. 13A and 13B are sections respectively showing steps of the vertical trench gate transistor semiconductor device fabricating method according to the second embodiment of the present invention, wherein FIG. 13A shows states in which the first region functioning as a transistor is formed and FIG. 13B shows states in which the second region for electrical contact with the body region of the transistor is formed.

FIG. 15A is a section showing a sate where a Zener diode is provided in the vicinity of a transistor part in the vertical trench gate transistor semiconductor device according to the first or second embodiment of the present invention, and FIG. 15B is a diagram schematically showing a circuit structure of the device shown in FIG. 15A.

DESCRIPTION OF THE PREFERRED EMBODIMENTS

First Embodiment

A vertical trench gate transistor semiconductor device according to the first embodiment of the present invention will be described below with reference to accompanying drawing. It is noted that the vertical trench gate transistor semiconductor device in the present embodiment is intended to compact the device without increase in contact resistance of the source region invited.

Figure 1A:
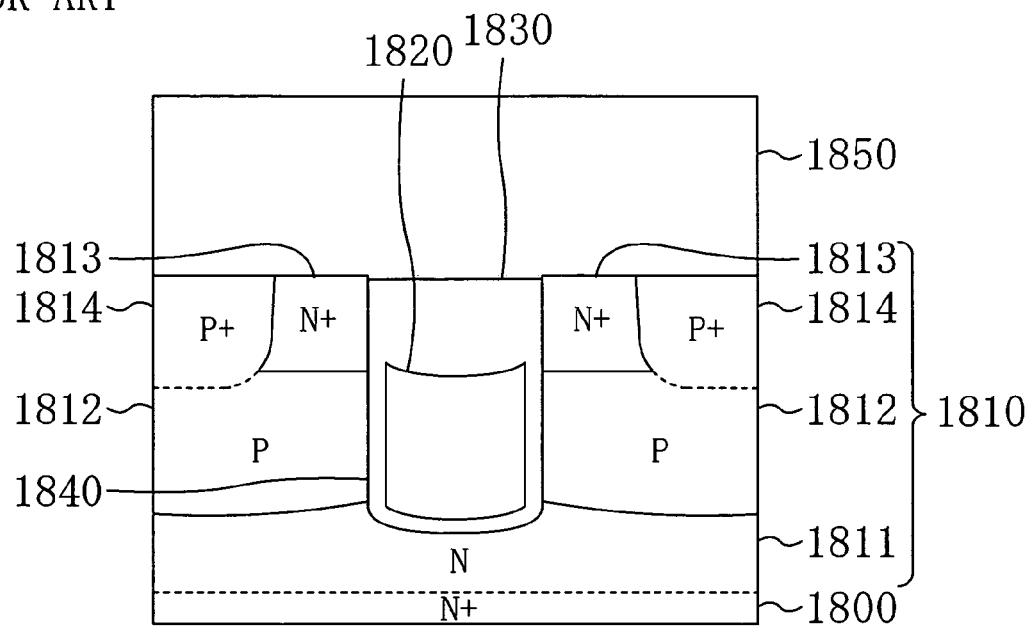
FIG. 1A and FIG. 1B are respectively a section and a plan view of a conventional vertical trench gate transistor semiconductor device.
Figure 1B:
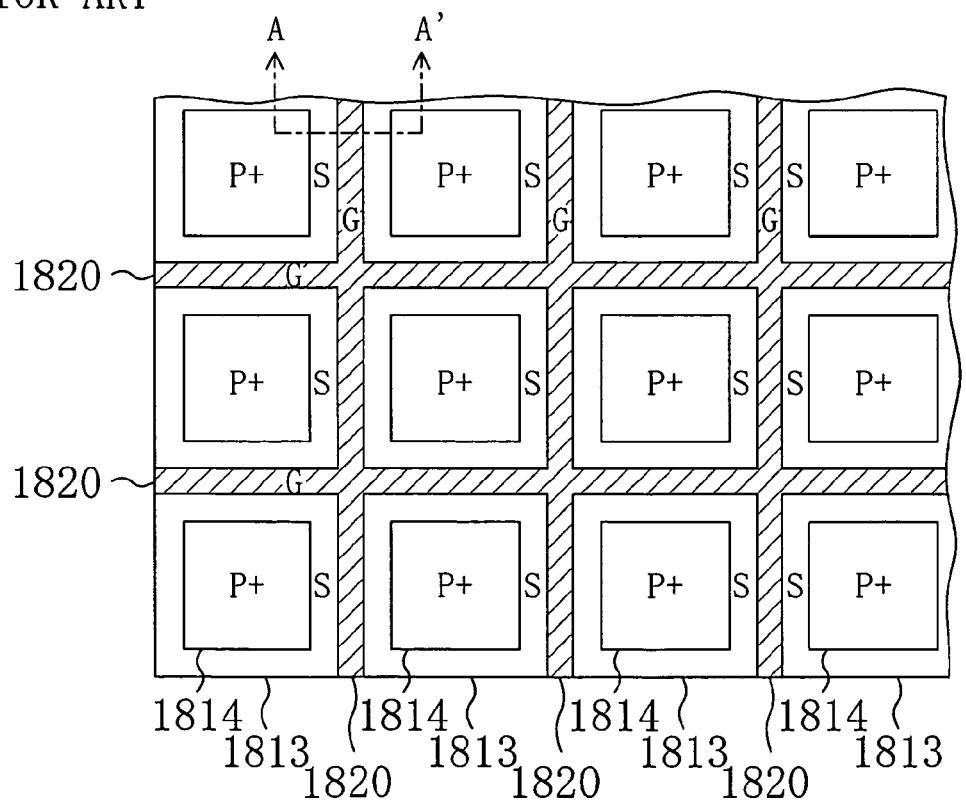
Figure 2A:
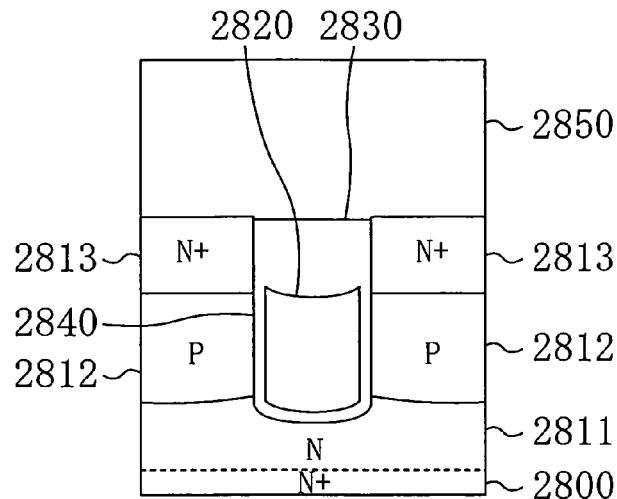
FIG. 2A and FIG. 2B are sections of another conventional vertical trench gate transistor semiconductor device and FIG. 2C is a plan view of this vertical trench gate transistor semiconductor device.
Figure 2B:
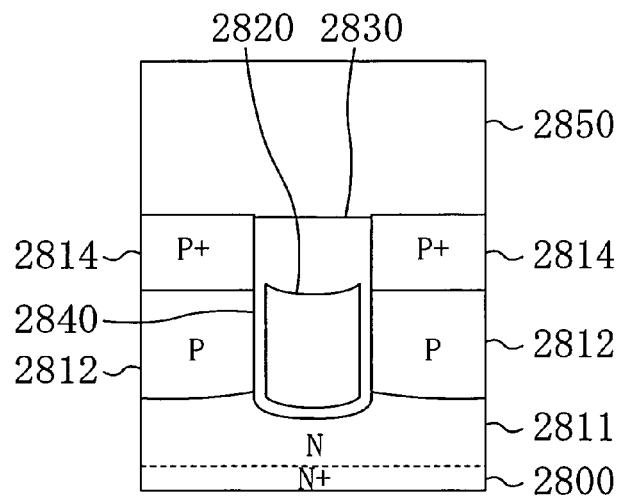
Figure 2C:
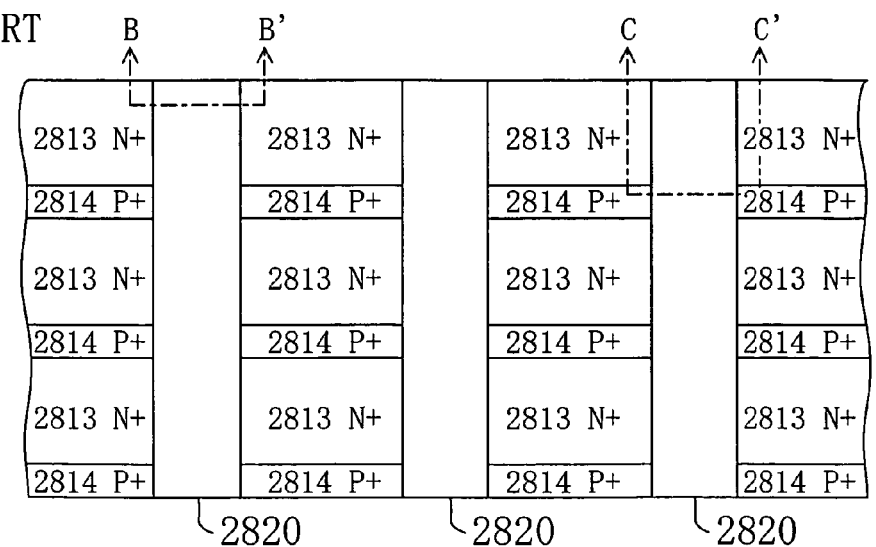
Figure 3:
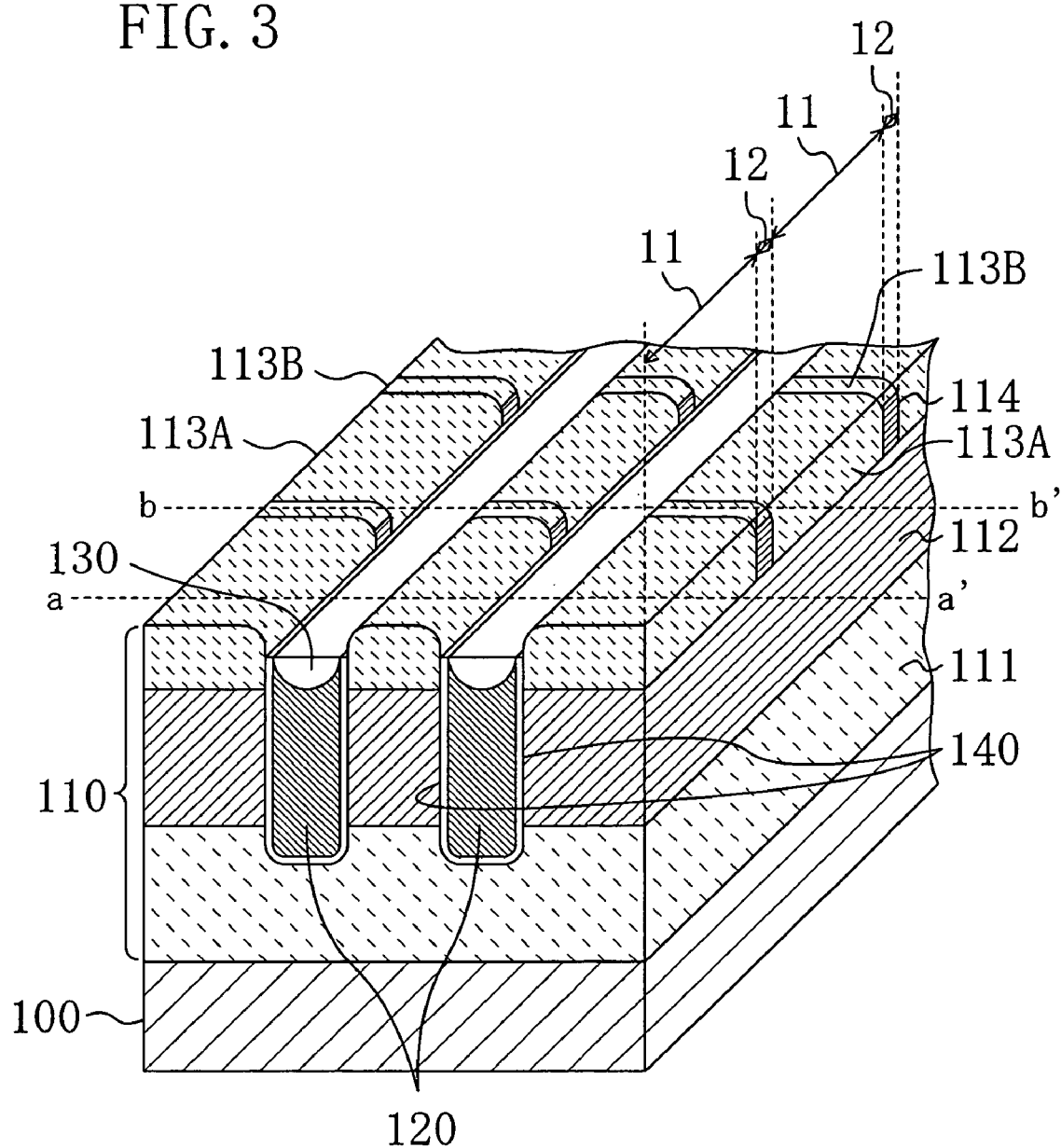
FIG. 3 is a bird's eye view of a vertical trench gate transistor semiconductor device according to a first embodiment of the present invention.

FIG. 3 is a bird's eye view (3-dimentional view) of the vertical trench gate transistor semiconductor device of the present embodiment. As shown in FIG. 3, in the vertical trench gate transistor semiconductor device of the present embodiment, a semiconductor layer 110 is formed on a N$^+$-type silicon substrate 100 serving as a first conductivity type semiconductor substrate by, for example, an epitaxial growth method. A plurality of trenches extending in stripes in the aforementioned semiconductor layer 110 are formed and a vertical gate electrode 120 is buried in each of the trenches. Also, a buried insulating film 130 is formed on the vertical gate electrode 120 in each trench. Wherein, the level of the uppermost face of the buried insulating film 130 is lower than the level of the surface of the semiconductor layer 110. An insulating material 140 serving as a gate insulating film intervenes between the vertical gate electrode 120 (specifically, the side face and the bottom face thereof) and the semiconductor layer 110. It is noted that the width of each trench in which the vertical gate electrode 120 is buried is set to about 0.25 µm and the intervals between the respective trenches are set to about 0.25 µm in the present embodiment. Further, the depth of each trench is set to 1.25 µm. Accordingly, the aspect ratio of each trench is about 5. Herein, the depth of each trench is a distance from the surface of a source region 113 described later to the bottom of the trench. Further, in the present embodiment, the number of the trenches is about 1500. In detail, about 1500 trenches are arranged in parallel and extend continuously across a first region 11 and a second region 12 (see FIG. 4C). A common electrode (metal wiring) 170 having a laminated structure of a barrier metal film 160 and an aluminum film 150 is formed, through not shown, on the semiconductor layer 110 including a recessed part above the buried insulating film 130 in each trench (see FIG. 4A and FIG. 4B).

As shown in FIG. 3, the semiconductor layer 110 periodically changes in a longitudinal direction (y direction in FIG. 3) of the trenches arranged in stripes which intersects at a right angle with a width direction (x direction in FIG. 3) of the trenches. In detail, the semiconductor layer 110 includes the first region 11 functioning as a transistor and the second region 12 functioning as an electrical contact with the body region of the transistor which are arranged alternately in the longitudinal direction of the trenches, namely, in the y direction (see FIG. 4C). In other words, the semiconductor layer 110 changes from the first region 11 to the second region 12 at a given point as a boundary in the y direction.

Figure 4A:
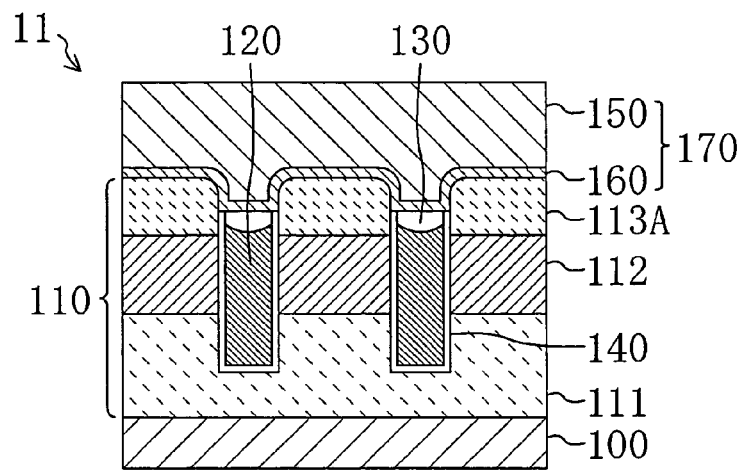
FIG. 4A is a section of a first region taken along a line a-a' of FIG. 3.
Figure 4B:
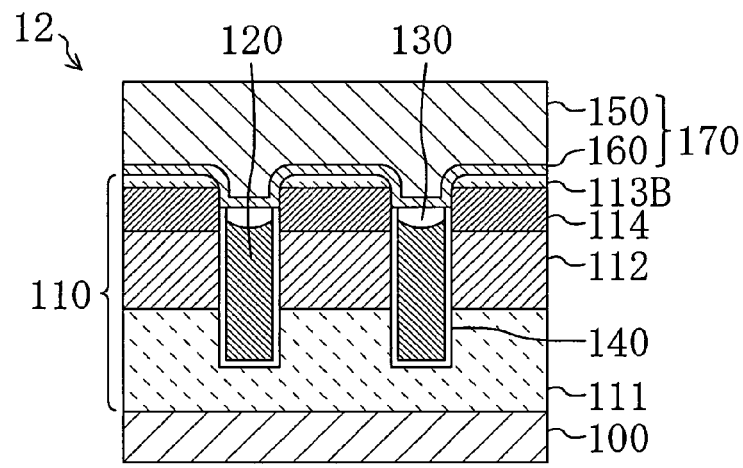
FIG. 4B is a section of a second region taken along a line b-b' of FIG. 3.
Figure 4C:
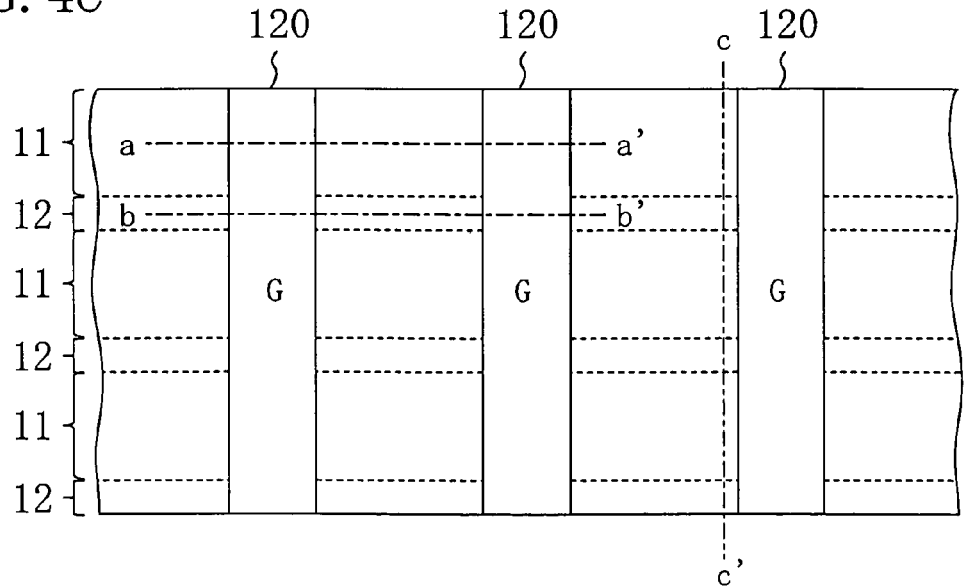
FIG. 4C is a plan view of the vertical trench gate transistor semiconductor device according to the first embodiment of the present invention.
Figure 5:
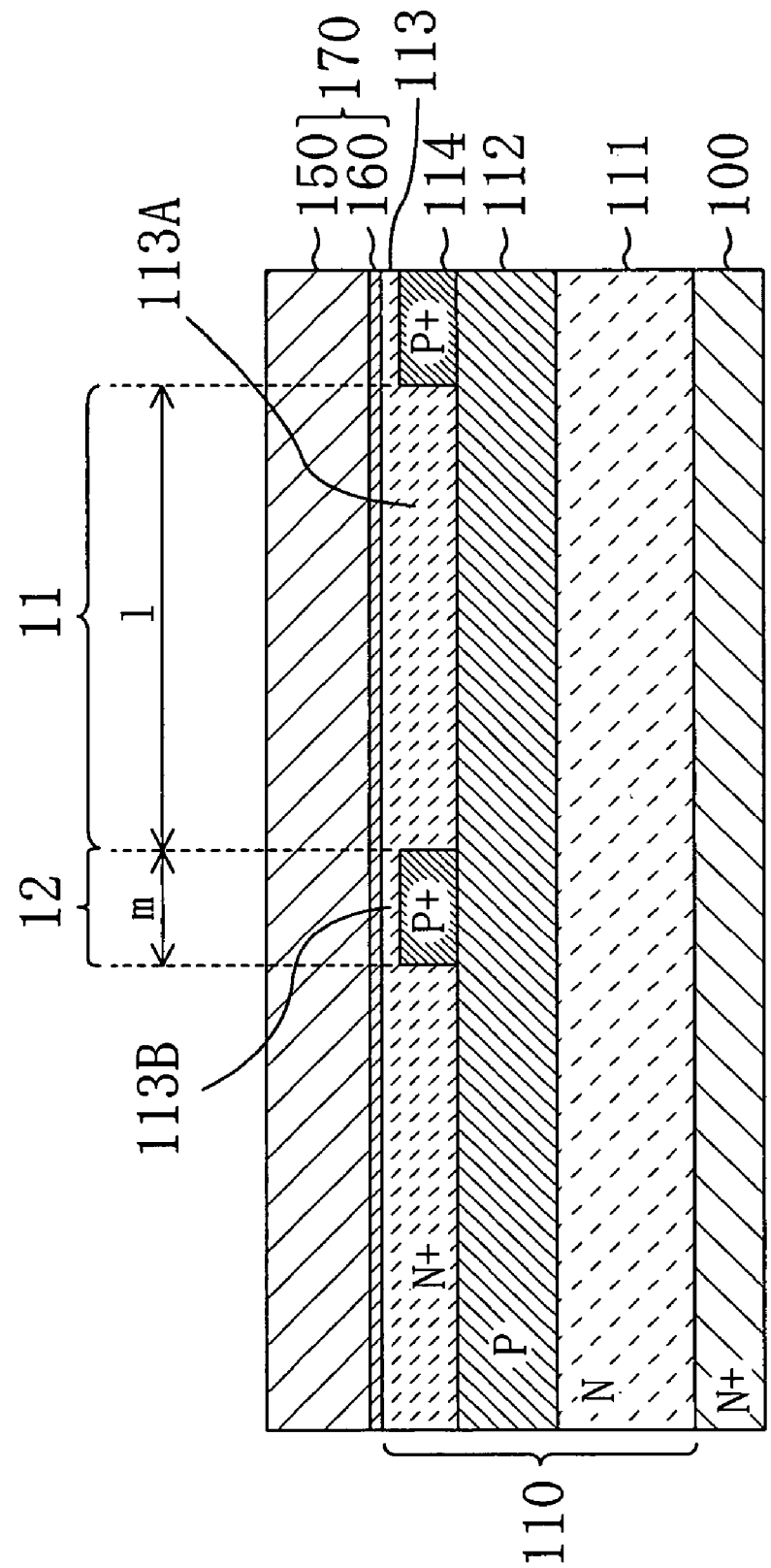
FIG. 5 is a section taken along a line c-c' of FIG. 4C.

FIG. 4A is a section of the first region 11 taken along a line a-a' of FIG. 3, and FIG. 4B is a section of the second region 12 taken along a line b-b' of FIG. 3. FIG. 4C is a schematic plan view showing the structure of the vertical trench gate transistor semiconductor device of the present embodiment, and FIG. 5 is a section taken along a line c-c' of FIG. 4C. It is noted that FIG. 4A also serves as a section taken along a line a-a' of FIG. 4C and FIG. 4B serves as a section taken along a line b-b' of FIG. 4C, also.

As shown in FIGS. 4A and 4B, in each of the first region 11 and the second region 12, the semiconductor layer 110 includes a drain region 111 of a first conductivity type (e.g., N-type) semiconductor layer, and a body region 112 of a second conductivity type (reverse polarity of the first conductivity type: e.g., P-type) semiconductor layer, which is formed on the drain region 111 and through which the gate trench passes. In other words, the drain region 111 and the body region 112 extend through the entirety of the semiconductor layer 110 including the first region 11 and the second region 12.

It is noted that in the vertical trench gate transistor semiconductor device in the present embodiment, a ratio of layout areas between the first region 11 and the second region 12 is determined according to a value of an allowable current that allows a current to flow to the transistor of the vertical trench gate transistor semiconductor device. Specifically, as shown in FIG. 5, the ratio l:m of the layout areas between the first region 11 and the second region 12 (ratio of the lengths in the y direction) is set to about 5:1 in the case where the device is composed of transistors that operate with a low current and is set to about 3:1 in the case where the device is composed of transistors that operate with a high current. Thus, in the case where the length of the gate trench is about 6 µm in the y direction and the device is composed of transistors that operate with a low current, the first region 11 has a length l of 5 µm in the y direction and the second region 12 has a length m of about 1 µm in the y direction.

Herein, as shown in FIG. 4A, the semiconductor layer 110 of the first region 11 includes a source region 113A, which is formed of a first conductivity type (e.g., N$^+$-type) semiconductor layer, on the body region 112.

On the other hand, as one of the significant features of the present embodiment, as shown in FIG. 4B, the semiconductor layer 110 of the second region 12 includes, on the body region 112, a body contact region 114 of a second conductivity type (e.g., P$^+$-type) and a source region 113B of the first conductivity type (e.g., N$^+$-type). The source region 113B is formed so as to cover the entirety of the upper part of the body contact region 114 and is electrically connected with the source region 113A of the first region 11. The thickness of the source region 113B is less than that of the source region 113A.

Further, the impurity concentration of the body contact region 114 is higher than that of the body region 112.

Namely, the semiconductor layer 110 of the first region 11 has a structure in which the source region 113A is formed on the body region 112 and the surface of the source region 113A serves as the principal plane of the semiconductor layer 110. On the other hand, the semiconductor layer 110 of the second region 12 has a structure in which the body contact region 114 is formed on the body region 112, the source region 113B is formed on the body contact region 114, and the surface of the source region 113B serves as the principal plane of the semiconductor layer 110.

Figure 6A:
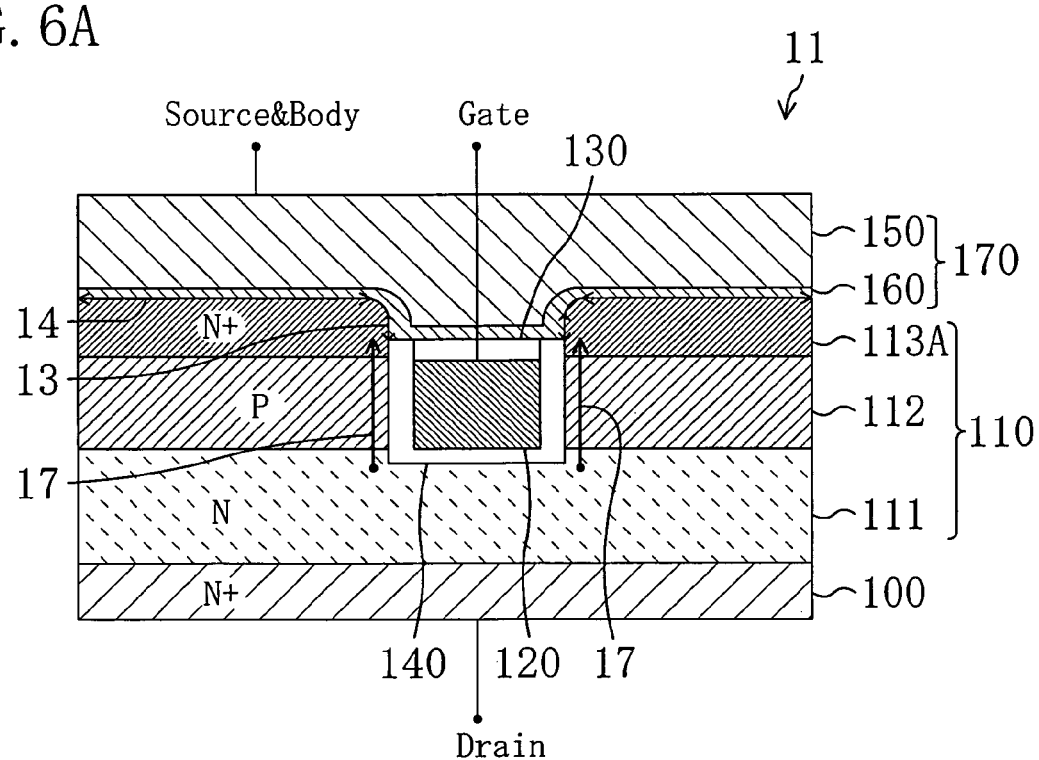
FIG. 6A is a diagram schematically showing a structure in section of a first region functioning as a transistor in the vertical trench gate transistor semiconductor device according to the first embodiment of the present invention.
Figure 6B:
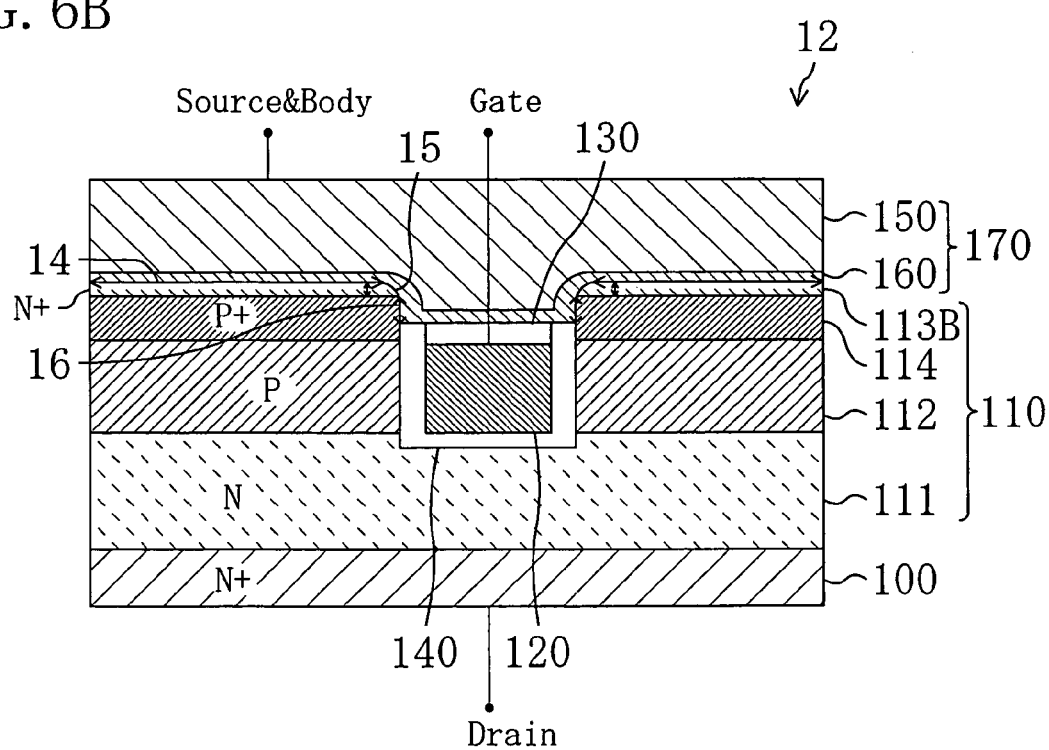
FIG. 6B is a diagram schematically showing a structure in section of a second region for electrical contact with the body region of the transistor in the vertical trench gate transistor semiconductor device according to the first embodiment of the present invention.

FIG. 6A is a diagram schematically showing the structure in section of the first region 11 functioning as a transistor and FIG. 6B is a diagram schematically showing the structure in section of the second region 12 functioning as an electrical contact with the body region. Wherein, in FIG. 6A and FIG. 6B, the same reference numerals are used for the same components as in FIG. 4A and FIG. 4B and the detailed description thereof is omitted.

A N-channel vertical trench gate DMOS transistor is exemplified as the vertical trench gate transistor semiconductor device of the present embodiment. As shown in FIGS. 6A and 6B, the vertical trench gate transistor semiconductor device of the present invention includes: a silicon substrate 100 of a $N^+$-type semiconductor substrate with a N-type (first conductivity type) impurity doped; a semiconductor layer 110 having a N-type drain region 111 and a P-type (second conductivity type) body region 112 which are formed on the silicon substrate 100; a vertical gate electrode 120 buried in a trench (a gate trench), which is formed in the semiconductor layer 110, with an insulating material 140 interposed; a buried insulating film 130 covering the upper face of the vertical gate electrode 120; and a common electrode 170 having a laminated structure of an aluminum film 150 to be a wring material and a barrier metal film 160.

Herein, as one of the significant features of the present embodiment, the vertical gate electrode 120, the insulating film 130, and the insulting material 140 surrounding the vertical gate electrode 120 are buried so as to form a recessed part (above-gate recessed part) in the upper part of the gate trench in each of the first region 11 and the second region 12, and the common electrode 170 is formed on the semiconductor layer 110 including the above-gate recessed part. Wherein, the buried insulating film 130 insulates the vertical gate electrode 120 from the common electrode 170.

Further, as shown in FIG. 6A, the first region 11 functioning as a transistor includes the source region 113A formed on the body region 112 so as to face the upper part of the vertical gate electrode 120. The source region 113A is formed in the upper portion of the semiconductor layer 110, so that the surface of the source region 113A serves as the surface of the semiconductor layer 110. A part of the source region 113A is exposed at the wall face of the above-gate recessed part so that the exposed part 13 and the upper face 14 of the source region 113A are in contact with the common electrode 170. In the N-channel vertical trench gate DMOS transistor of the present embodiment having the above structure, the source region 113A is insulated electrically from the gate electrode 120 by means of the buried insulating film 130 and the insulating material 140 for realizing a function as a transistor. When a high voltage is applied between the source electrode (i.e., the common electrode 170) and the drain electrode (not shown in the drawings) and a voltage higher than the threshold voltage is applied between the gate electrode 120 and the source region 113A, a n-type inversion layer (i.e., channel layer) is formed at the interface between the insulating material 140 to be a gate insulating film and the P-type body region 112 (i.e., two interface on both sides of the gate electrode 120), as shown in FIG. 6A, so that a current 17 flows from the drain region 111 to the source region 113A through the inversion layer. When the voltage applied to the gate electrode 120 is lower than the threshold voltage, no n-type inversion layer is formed in the body region 112, so that the vertical trench gate DMOS transistor is in OFF state between the source and the drain.

As shown in FIG. 6B, the second region 12 functioning as an electrical contact with the body region 112 includes the body contact region 114 formed on the body region 112 and the source region 113B formed on the body contact region 114. In detail, the source region 113B is formed in the uppermost portion of the semiconductor layer 110 so that the surface of the source region 113B serves as the surface of the semiconductor layer 110, and the surface of the source region 113B covers the upper face of the body contact region 114. The body region 112 and the body contact region 114 are in contact with each other and the body contact region 114 and the source region 113B are in contact with each other. Further, a part of the source region 113B and a part of the body contact region 114 are exposed at the wall face of the above-gate recessed part so that each exposed part 15 and 16 and the upper face 14 of the source region 113B are in contact with the common electrode 170. In detail, the body contact region 114 is in contact with the common electrode 170 at the wall face of the above-gate recessed part and the source region 113B is in contact with the common electrode 170 at the wall face of the above-gate recessed part and the surface of the semiconductor layer 110. In this manner, the common electrode 170 is commonly connected to the source region 113B and the body contact region 114, thereby preventing a parasitic bipolar transistor from being in ON state. Specifically, in a case of a device composed of transistors that operate with a low current, the body contact region 114 is set so as to be in contact with the common electrode 170 at the wall face of the above-gate recessed part of which height is, for example, greater than 100 nm, if the area ratio (l:m) between the first region 11 and the second region 12 is 5:1.

Herein, as shown in FIG. 3, the semiconductor layer 110 forming the upper edge (upper end) of the trench has a rounded shape. In detail, the source region 113A forming the upper edge of the trench in the first region 11 is rounded as shown in FIG. 6A and the source region 113B forming the upper edge of the trench in the second region 12 is also rounded as shown in FIG. 6B.

Description will be made below about a method for fabricating the above described vertical trench gate transistor semiconductor device (see FIG. 3 and the like) of the present embodiment by exemplifying a method for fabricating a N-channel vertical trench gate DMOS transistor, with reference to the drawings.

FIG. 7A through FIG. 7F, FIG. 8A through FIG. 8F, FIG. 9A through FIG. 9F, FIG. 10A through FIG. 10F and FIG. 11A through FIG. 11F are sections showing steps of the method for fabricating the vertical trench gate transistor semiconductor device of the present embodiment. Wherein, FIGS. 7A, 7C and 7E, FIGS. 8A, 8C and 8E, FIGS. 9A, 9C and 9E, FIGS. 10A, 10C and 10E and FIGS. 11A, 11C and 11E show states in which the first region 11 functioning as a transistor is formed, and FIGS. 7B, 7D and 7F, FIGS. 8B, 8D and 8F, FIGS. 9B, 9D and 9F, FIGS. 10B, 10D and 10F and FIGS. 11B, 11D and 11F show states in which the second region 12 functioning as an electrical contact with the body region of the transistor is formed. As described above, the first region 11 and the second region 12 are arranged adjacent to each other alternately along a direction along which the trench gate extends. In FIG. 7A through FIG. 7F, FIG. 8A through FIG. 8F, FIG. 9A through FIG. 9F, FIG. 10A through FIG. 10F and FIG. 11A through FIG. 11F, the same reference numerals are assigned to the same components as those in FIG. 3, FIG. 4A and FIG. 4B and the detailed description thereof is omitted.

Figure 7A:
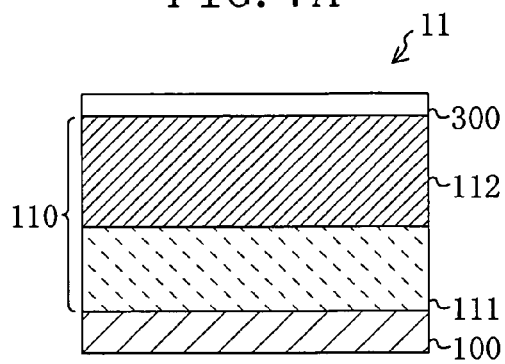
Figure 7B:
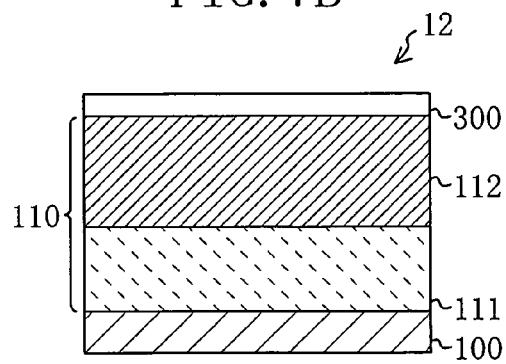

First, as shown in FIG. 7A and FIG. 7B, after a lightly doped first conductivity type (e.g., N-type) semiconductor layer (epitaxial layer) 110 is formed on a silicon substrate 100 of a heavily doped first conductivity type (e.g., $N^+$-type) semiconductor substrate by, for example, an epitaxial growth method, the second conductivity type (e.g., P-type) impurity is implanted to the upper portion of the semiconductor layer 110. Whereby, the semiconductor layer 110 composed of the first conductivity type (e.g., N-type) drain region 111 and the second conductivity type (e.g., P-type) body region 112 formed thereon is formed in each of the first region 11 and the second region 12. Subsequently, a silicon oxide film 300 having a thickness of about 50 to 500 nm is formed on the surface of the semiconductor layer 110 by, for example, thermal oxidation. It is noted that the body region 112 may be formed by ion implantation or epitaxial growth. Wherein, in order to obtain a stable impurity concentration of the body region 112 where a channel layer is to be formed, the epitaxial growth is the most suitable method for forming the body region 112.

Figure 7C:
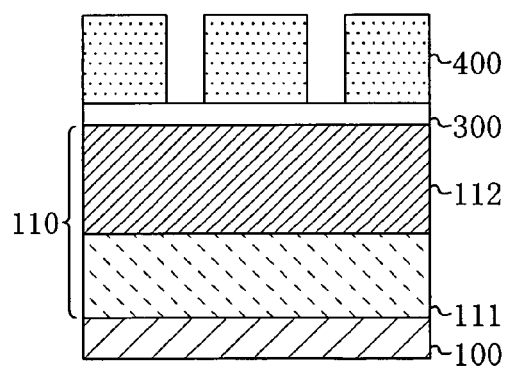
Figure 7D:
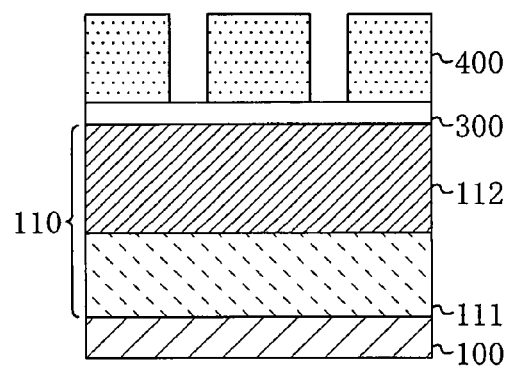
Figure 7E:
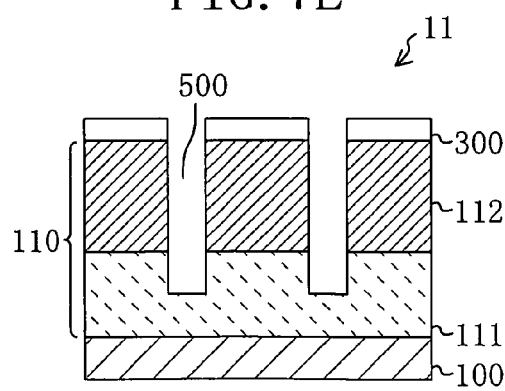
Figure 7F:
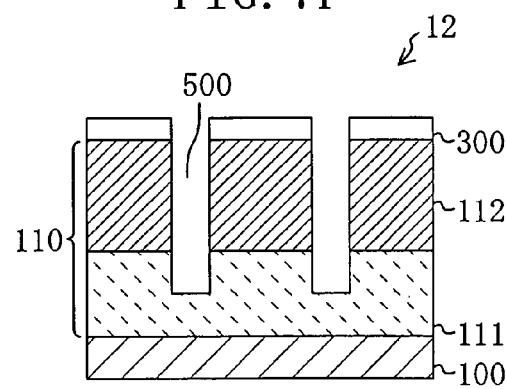

Next, as shown in FIG. 7C and FIG. 7D, a resist pattern 400 having an opening at a portion corresponding to the gate trench formation region is formed on the silicon oxide film 300. Subsequently, dry etching is performed to the silicon oxide film 300, using the resist pattern 400 as a mask. After removing the resist pattern 400 as shown in FIG. 7E and FIG. 7F, dry etching is performed to the semiconductor layer 110 using the thus patterned silicon oxide film 300 as a mask, whereby a plurality of trenches 500 are formed each of which passes through the body region 112 and reaches the upper part of the drain region 111. The depth of each trench 500 is in a range between about 0.8 and 3.0 μm, for example, and the intervals between the trenches 500 are equal in the case where three or more trenches 500 are arranged. The trenches 500 extend continuously across the body region 112 in the first region 11 and the second region 12.

Figure 8A:
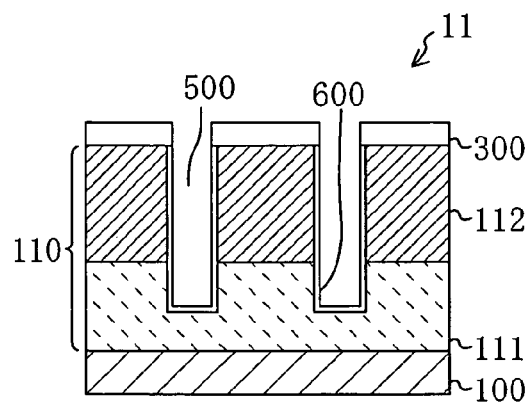
Figure 8B:
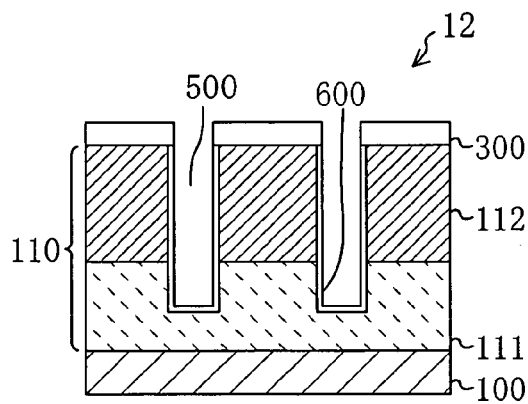

Next, as shown in FIG. 8A and FIG. 8B, in order to remove a damaged layer at the wall part and the bottom part of each trench 500, a silicon oxide film 600 having a thickness of 200 to 100 nm is formed at the wall part and the bottom part of each trench 500 by thermal oxidation, for example.

Figure 8C:
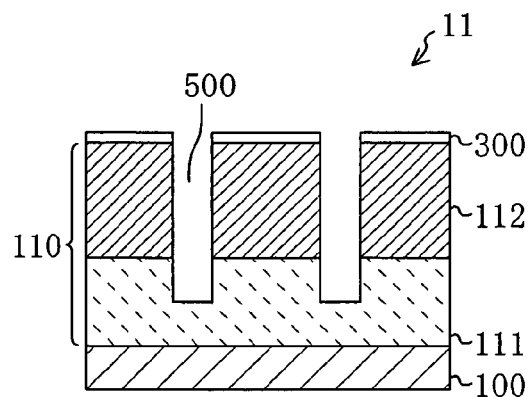
Figure 8D:
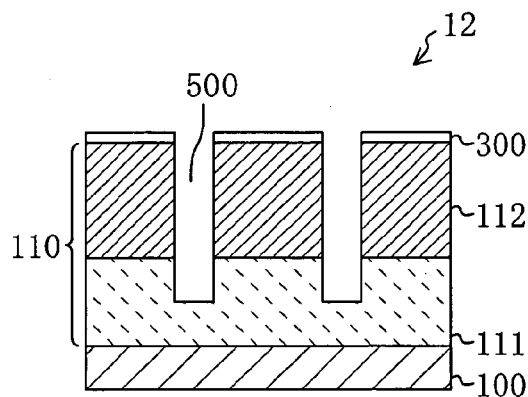

Next, as shown in FIG. 8C and FIG. 8D, the silicon oxide film 600 formed on the inner wall of each trench 500 is removed by wet etching, for example. Though the silicon oxide film 300 on the semiconductor layer 110 is also etched to some extent at this time, the silicon oxide film 300 has a sufficient thickness on the semiconductor layer 110 even after the removal of the silicon oxide film 600.

Figure 8E:
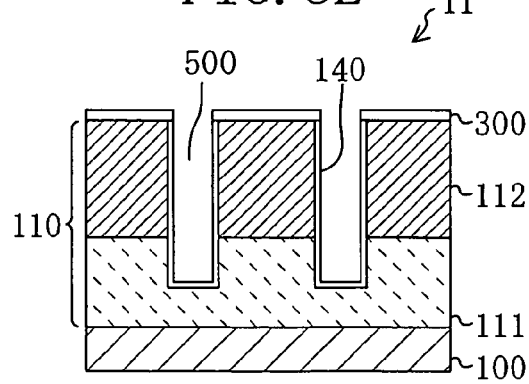
Figure 8F:
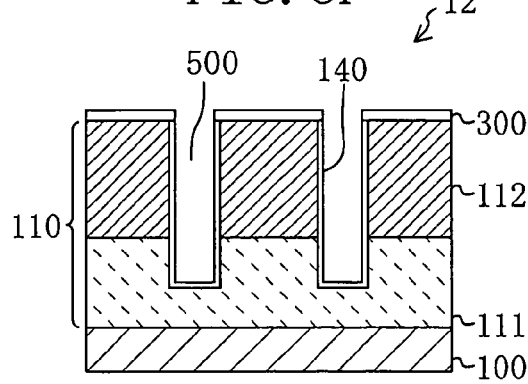

Then, as shown in FIG. 8E and FIG. 8F, an insulating material 140, which is, for example, an oxide film or the like having a thickness of about 8 to 100 nm, is formed on the wall face and the bottom face of each trench 500. The insulating material 140 is $SiO_2$ and functions as a gate insulating film.

Figure 9A:
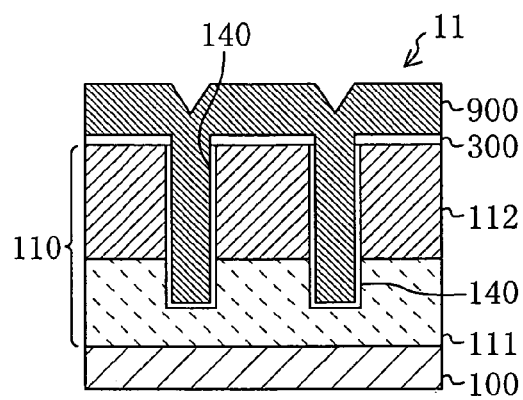
Figure 9B:
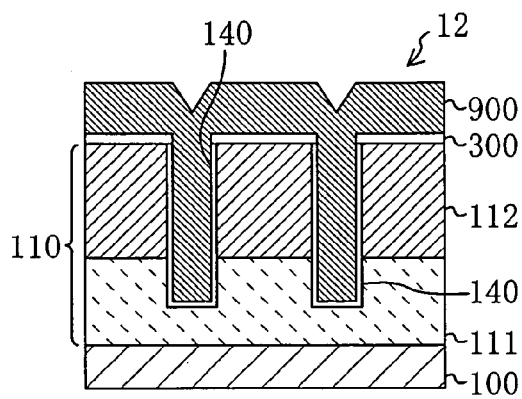

Then, as shown in FIG. 9A and FIG. 9B, after a conductive film to be a material of the gate electrode, for example, a polysilicon layer 900 is deposited on the surface of the silicon oxide film 300 including the inner wall of each trench 500, an impurity for forming a gate electrode is implanted to the polysilicon film 900, and then, a thermal treatment is performed. In this treatment, the polysilicon layer 900 is deposited to have a thickness of, for example, 300 to 8000 nm on the surface of the silicon oxide film 300. It is noted that it is possible to deposit a polysilicon film, in which an impurity (e.g., phosphorus) for forming a gate electrode is doped, directly on the silicon oxide film 300 by, for example, CVD (chemical vapor deposition), instead that the impurity implantation is performed separately after the deposition of the polysilicon film 900.

Figure 9C:
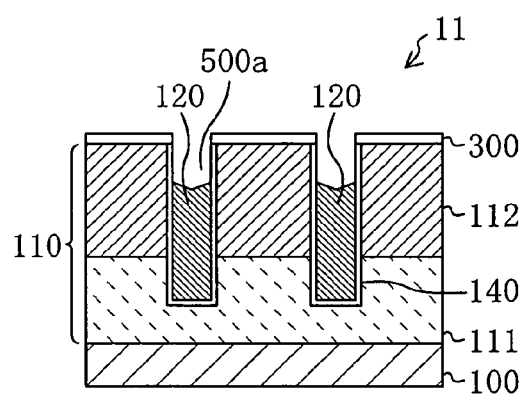
Figure 9D:
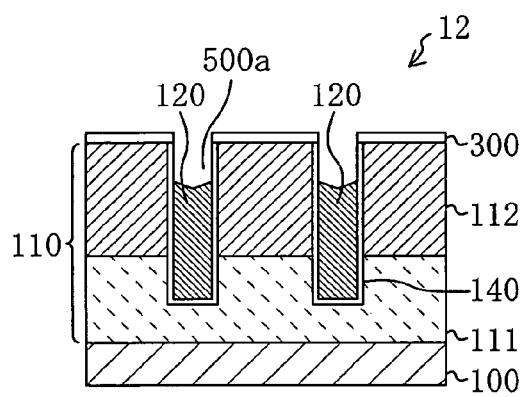

Then, as shown in FIG. 9C and FIG. 9D, etching is performed to the entirety of the polysilicon film 900 to remove a part of the polysilicon film 900 located over the surface of the silicon oxide film 300 and a part of the polysilicon film 900 located in the upper part of each trench 500, so that the vertical gate electrode 120 is formed inside each trench 500. The etching to the polysilicon film 900 in each trench 500 is performed to etch it down to, for example, about 200 to 800 nm from the surface of the silicon oxide film 300. Accordingly, a concave part 500a is formed above the vertical gate electrode 120 in each trench 500.

Figure 9E:
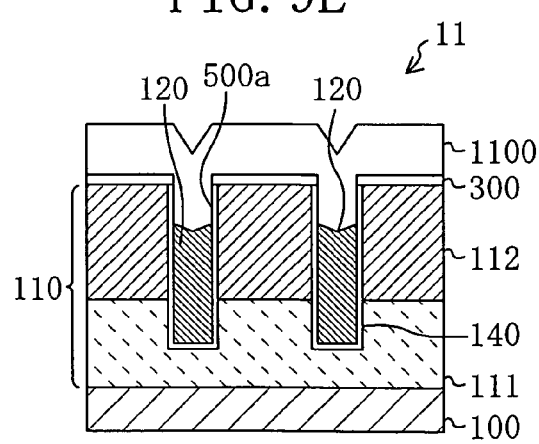
Figure 9F:
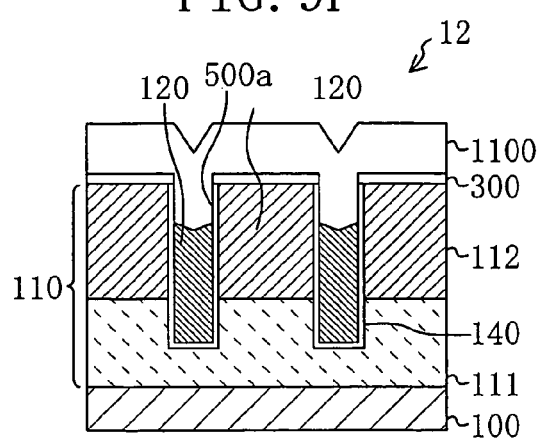

Subsequently, as shown in FIG. 9E and FIG. 9F, a silicon oxide film 1100 is formed to have a thickness of, for example, about 400 to 800 nm on the surface of the silicon oxide film 300 and in the concave part 500a to fill the concave part 500a.

Figure 10A:
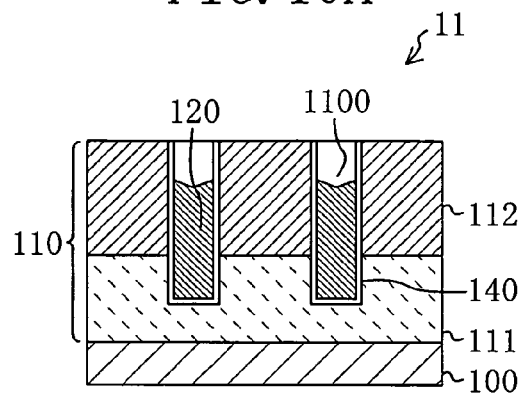
Figure 10B:
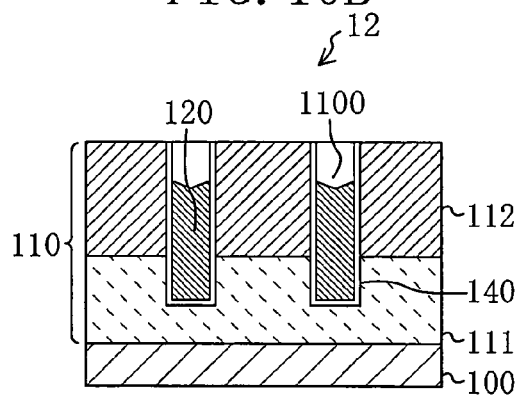

Next, as shown in FIG. 10A and FIG. 10B, etch back for planarization using a resist is performed to the silicon oxide film 1100 and the silicon oxide film 300 sequentially to remove the silicon oxide film 300 and the silicon oxide film 1100 so as to equalize the level of the uppermost face of the silicon oxide film 1100 in the concave part 500a above the vertical gate electrode 120 to the level of the surface of the semiconductor layer 110. Whereby, each trench 500 is filled with the silicon oxide film 1100 and the vertical gate electrode 120.

Figure 10C:
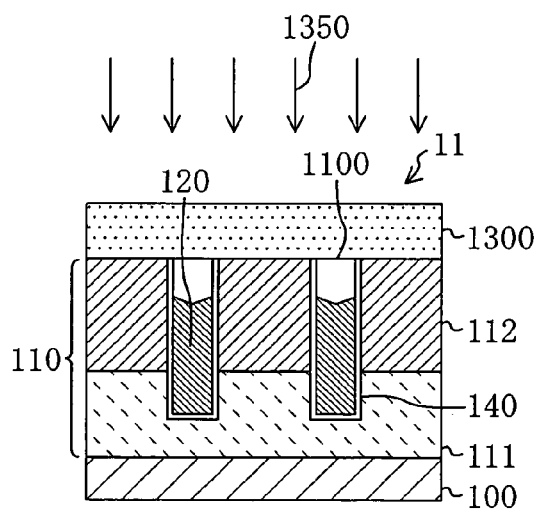
Figure 10D:
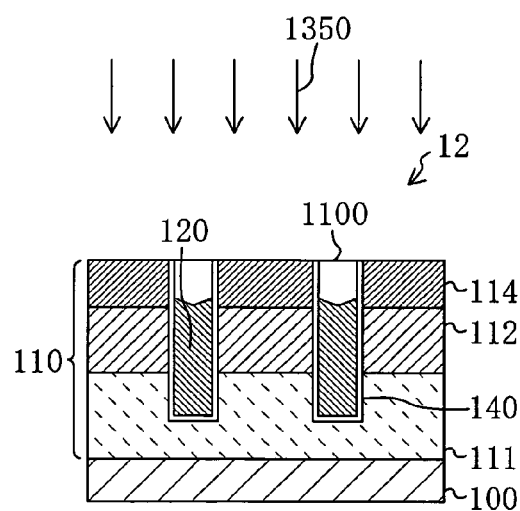

Subsequently, as shown in FIG. 10C and FIG. 10D, a second conductivity type impurity (e.g., P-type boron) 1350 is implanted to the surface portion of the semiconductor layer 110 of the second region 12, using a resist pattern 1300 covering the semiconductor layer 110 of the first region 11 as a mask. Thus, the second conductivity type (e.g., $P^+$-type) body contact region 114 having a higher impurity concentration than that of the body region 112 is formed in the surface portion of the semiconductor layer 110 of the second region 12, namely, over the body region 112 of the second region 12.

Figure 10E:
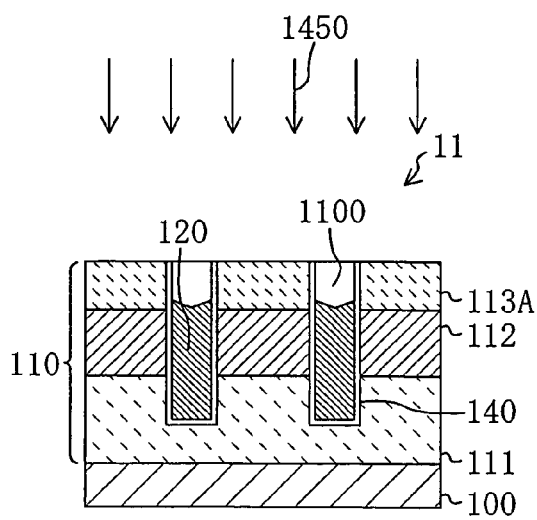
Figure 10F:
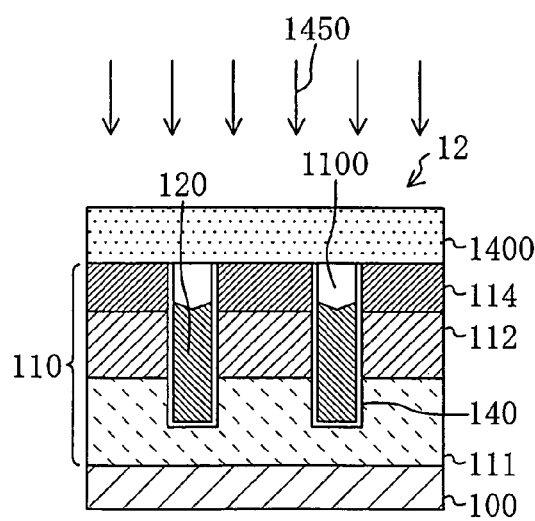

Next, after removing the resist pattern 1300, a first conductivity type impurity (e.g., N-type phosphorus) 1450 is implanted to the surface portion of the semiconductor layer 110 of the first region 11, using a resist pattern 1400 covering the semiconductor layer 110 of the second region 12 as a mask, as shown in FIG. 10E and FIG. 10F. Thus, the first conductivity type (e.g., $N^+$-type) source region 113A is formed in the surface portion of the semiconductor layer 110 of the first region 11, namely, over the body region 112 of the first region 11.

Figure 11A:
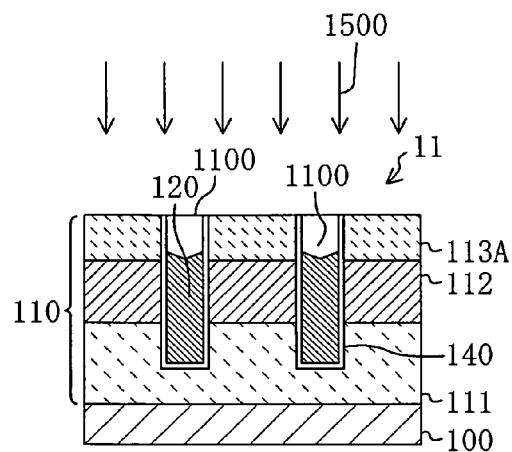
Figure 11B:
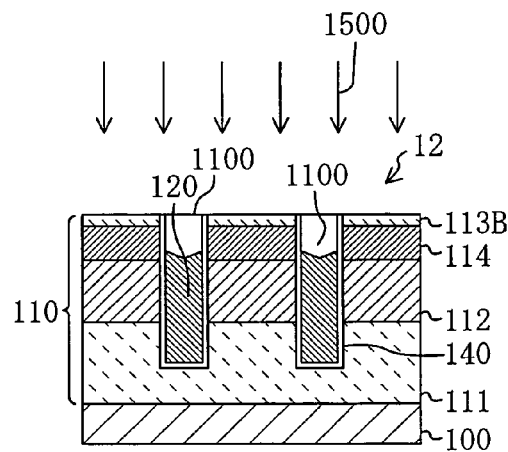

Next, after removing the resist pattern 1400, a first conductivity type impurity (e.g., N-type phosphorus) 1500 is implanted to the entire surface portion of the semiconductor layer 110, as shown in FIG. 11A and FIG. 11B. Thus, the first conductivity type (e.g., $N^+$-type) source region 113B is formed in the surface portion of the semiconductor layer 110 of the second region 12. It is noted that the depth of the source region 113B is shallower than the depth of the body contact region 114 in the semiconductor layer 110 of the second region 12. Namely, the ion implantation is performed so that the $N^+$-type source region 113B is formed in the upper portion of the $P^+$-type body contact region 114. Also, the thickness of the source region 113B of the second region 12 is smaller than the thickness of the source region 113A of the first region 11. Because, the N-type impurity (phosphorus), which is a reverse conductivity type of the P-type in the body contact region 114, is implanted. In the present embodiment, the source region 113B is formed so as to cover the entirety of the body contact region 114 of the second region 12. The impurity concentration of the source region 113A is a sum of each concentration of the implanted impurities 1450 and 1500.

Figure 11C:
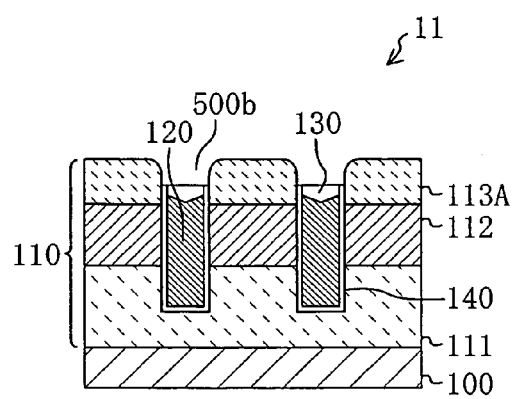
Figure 11D:
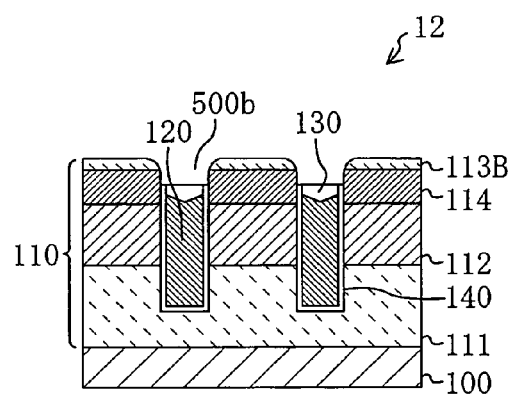

Next, as shown in FIG. 11C and FIG. 11D, respective parts of the silicon oxide film 1100 and the insulating material 140 on the vertical gate electrode 120 in each trench 500 are removed by dry etching, for example, so that a recessed part 500b is formed above the vertical gate electrode 120 in each trench 500 and the source regions 113A, 113B exposed at the upper edge (upper end) of the recessed part 500b are rounded. The conditions of this dry etching are adjusted so that the selection ratio of silicon to the silicon oxide film 1100 is in the range between 2 and 5, both inclusive, thereby efficiently rounding the source regions 113A, 113B exposed at the upper edge of the recessed part 500b.

The etching to the silicon oxide film 1100 and the insulating material 140 on the vertical gate electrode 120 shown in FIG. 11C and FIG. 11D is performed so as to expose the source region 113A at the wall face of the recessed part 500b of the first region 11 and so as to expose the body contact region 114 and the source region 113B at the wall face of the recessed part 500b of the second region 12. In detail, the dry etching to the silicon oxide film 1100 and the insulating material 140 in each trench 500 is performed to etch them down to about 100 to 300 nm, for example, from the surface of the semiconductor layer 110. This dry etching is stopped before the silicon oxide film 1100 on the vertical gate electrode 120 is thoroughly removed with the buried insulating film 130 left on the vertical gate electrode 120. This buried insulating film 130 electrically insulates the vertical gate electrode 120 from the common electrode 170 (shown in FIG. 11E and FIG. 11F).

Figure 11E:
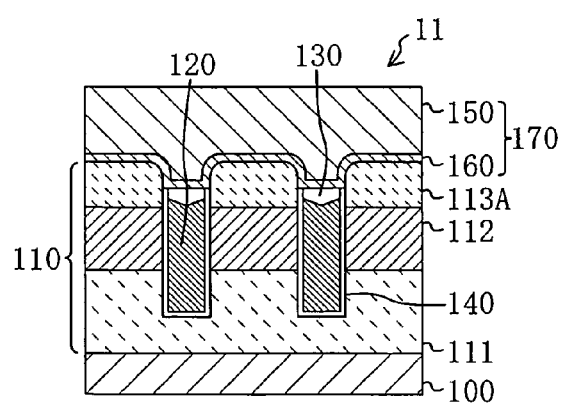
Figure 11F:
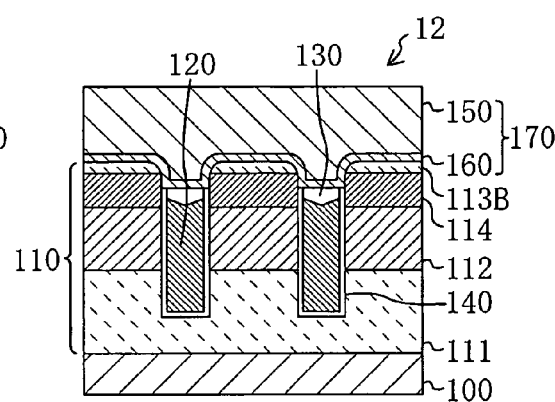

Next, as shown in FIG. 11E and FIG. 11F, after the barrier metal film 160 and the conductive film (e.g., aluminum film) 150 for wiring are sequentially deposited on the surface of the semiconductor layer 110 including a part on the buried insulating film 130 in the recessed part 500b, the aluminum film 150 and the barrier metal film 160 are patterned to form the common electrode 170. Thus, the source region 113A and the common electrode 170 are electrically connected to each other at the wall face of the recessed part 500b of the first region 11. Further, it is needless to say that the source region 113A is electrically connected to the common electrode 170 at the upper face thereof. In addition, at the wall face of the recessed part 500b of the second region 12, the body contact region 114 and the source region 113B are electrically connected to the common electrode 170. In other words, the source region 113B and the body contact region 114 are surely connected to the electrode 170 commonly at the wall face of each gate trench 500 of the second region 12. Also, it is needless to say that the source region 113B is electrically connected at the upper face thereof to the common electrode 170.

In the above described first embodiment, the source region 113B electrically connected to the source region 113A of the first region 11 functioning as a transistor is formed over the body region 112 (specifically, the body contact region 114 in the upper portion of the body region 112) in the second region 12 functioning as an electrical contact with the body region 112. In other words, the surface of the source region 113B, instead of the surface of the body contact region 114, serves as the surface of the semiconductor layer 110 in the vicinity of each trench 500. Therefore, the contact area between the common electrode 170 and the source region can be sufficiently ensured without reduction in layout area of the body contact region 114 even in the case where the intervals between the gate electrodes 120 are shortened in association with size reduction of the device. Hence, a compact vertical trench gate transistor semiconductor device is realized with no increase in contact resistance of the source region.

In the first embodiment, the body region 112 (specifically, the body contact region 114 in the upper portion of the body region 112) of the second region 12 is electrically connected through the wall face of the recessed part 500b (see FIG. 11D and FIG. 11F) above the gate electrode 120 in each trench 500, and therefore, the contact area between the common electrode 170 and the body contact region 114 can be surely ensured. Hence, a potential difference is prevented from being caused in the body region 112 in the operation of the transistors, with a result that operation of a parasitic bipolar transistor can be prevented.

In the first embodiment, the source regions 113A and 113B are formed in the entire surface of the semiconductor layer 110 and on the wall part of each trench 500. In other words, as shown in FIG. 5, the respective surfaces of the source regions 113A and 113B serve as the surface of the semiconductor layer 110 and the source regions 113A and 113B are exposed at the wall face of the recessed part 500b above the gate electrode 120. Accordingly, each exposed part and the respective surfaces (the upper faces) of the source regions 113A and 113B are in contact with the common electrode 170, so that the contact area between the common electrode 170 and the source region increases, with a result of further reduction in contact resistance of the source region. Specifically, in comparison with a case where the source region is not formed in the entire surface portion of the semiconductor layer 110 as in conventional cases, namely, the case where the source region is not formed over the body contact region 114 of the second region 12, ON resistance of the transistors can be reduced.

In the first embodiment, in addition to electrical contact of both the first region 11 and the second region 12 with the source regions 113A and 113B, the body region 112 (the body contact region 114) is in electrical contact in common to the source region 113B in the second region 12. Hence, the intervals between the gate electrodes 120 can be reduced, and accordingly, further size reduction of the device is promoted.

In the first embodiment, the source region 113B of the second region 12 is smaller in thickness than the source region 113A of the first region 11. Therefore, electrical contact of the source region 113B and the body contact region 114 through the wall face of each trench 500 (specifically, the recessed part 500b) of the second region 12 can be ensured even in the case where the depth of each gate trench 500 of the second region 12 is the same as that of each gate trench 500 of the first region 11.

Further, in the first embodiment, the source region 113B covers the entirety of the body contact region 114 of the second region 12. Therefore, the formation of the gate electrode 120 to form the recessed part 500b in the upper part of each trench 500 allows the source region 113A and 113B to be in electrical contact through the wall face of the recessed part 500b in each of the first region 11 and the second region 12.

Furthermore, in the first embodiment, the body contact region 114 having a higher impurity concentration than that of the other part of the body region 112 is formed in the upper portion of the body region 112 of the second region 12, and hence, electrical contact with the body region 112 is further ensured.

Moreover, in the first embodiment, the source regions 113A and 113B are formed after the formation of the trenches 500, with a result that the thermal treatment step after the formation of the source regions can be moderated. Accordingly, impurity diffusion in the source regions 113A and 113B can be controlled, and therefore, the device dimension can be accurately controlled. Hence, transistor characteristics as designed can be easily attained.

Further, in the first embodiment, the impurity is introduced to parts to be the source regions 113A and 113B of the semiconductor layer 110 by ion implantation simultaneously with the formation of the source region 113B of the second region 12. In other words, the ion implantation is performed to the entirety of the semiconductor layer 110. As a result, the source region 113B can be formed without an additional lithography step involved.

In addition, in the first embodiment, the source regions 113A, 113B forming the upper edge of each trench are rounded, so that void is prevented from being formed in the barrier metal film 160 and the conductive film 150 for wiring in the step of forming the barrier metal film 160 and the conductive film 150 for wiring on the source regions 113A, 113B. Further, the step coverage of the source regions 113A, 113B and the barrier metal film 160 or the conductive film 150 for wiring can be improved, enabling reduction in contact resistance of the source regions 113A, 113B and reduction in ON resistance. In addition, stress concentration on the upper edge of each trench from the barrier metal film 160 and the conductive film 150 for wiring can be mitigated compared with a case with a square-cornered upper edge of each trench, thereby suppressing a leak current.

It is noted that in the first embodiment, the step of forming the source region 113A of the first region 11 as shown in FIG. 10E and FIG. 10F is performed after the step of forming the body contact region 114 as shown in FIG. 10C and FIG. 10D. However, it is, of course, possible to perform the step of forming the body contact region 114 after the step of forming the source region 113A of the first region 11.

Second Embodiment

A vertical trench gate transistor semiconductor device and a method of fabricating it according to the second embodiment of the present invention will be described below with reference to the drawings. It is noted that the vertical trench gate transistor semiconductor device in the present embodiment is intended to compact the device without increase in contact resistance of the source region invited, similar to the first embodiment.

Figure 13A:
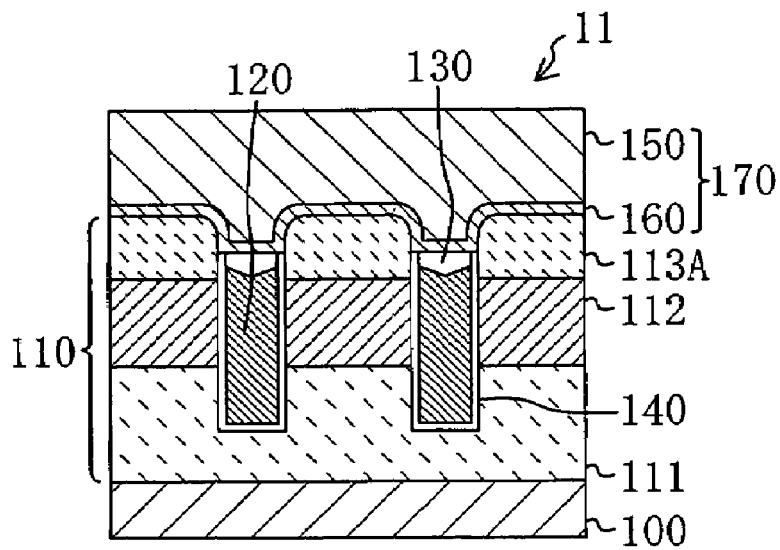
Figure 13B:
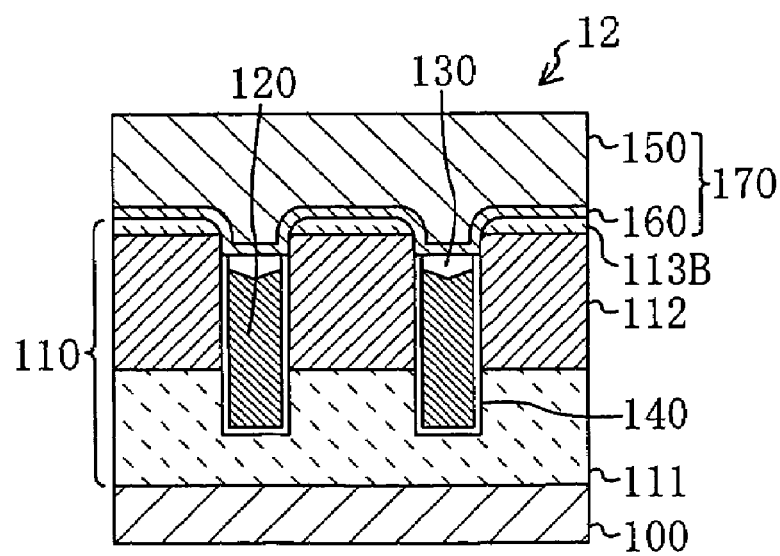

The difference of the present embodiment from the first embodiment is that a region (corresponding to the body contact region 114 in the first embodiment) having a relatively high impurity concentration (e.g., $5\times10^{19}$ to $1\times10^{20}$ count/cm$^3$) is not formed in the upper portion of the body region 112 having a relatively low impurity concentration (e.g., in the order of $10^{17}$ count/cm$^3$) in the second region 12 (see FIG. 11B and FIG. 13B). Wherein, the body region 112 of the second region 12 in the present embodiment has an impurity concentration (e.g., in the order of $10^{18}$ count/cm$^3$) which enables sufficient Ohmic contact with the common electrode 170.

The vertical trench gate transistor semiconductor device fabricating method in the present embodiment is the same as in the first embodiment until the step shown in FIG. 10A and FIG. 10B. Namely, in the present embodiment, the same steps as in the first embodiment shown in FIG. 7A through FIG. 7F, FIG. 8A through FIG. 8F, FIG. 9A through FIG. 9F and FIG. 10A and FIG. 10B are performed in the present embodiment. FIG. 12A through FIG. 12F and FIG. 13A and FIG. 13B are sections respectively showing the steps after the steps shown in FIG. 10A and FIG. 10B in the vertical trench gate transistor semiconductor device fabricating method of the present embodiment. Wherein, FIG. 12A, FIG. 12C, FIG. 12E and FIG. 13A show states in which the first region 11 functioning as a transistor is formed and FIG. 12B, FIG. 12D, FIG. 12F and FIG. 13B show states in which the second region 12 functioning as an electrical contact with the body region of the transistor is formed. As described above, the first region 11 and the second region 12 are arranged alternately along the direction along which each trench gate extends so as to be adjacent to each other. Further, the same reference numerals as in FIG. 3, FIG. 4A, FIG. 4B and the like are assigned to the same components in FIGS. 12A through 12F and FIG. 13A and FIG. 13B and the detailed description thereof is omitted.

Specifically, in the present embodiment, after the step shown in FIG. 10A and FIG. 10B, the impurity implantation is not performed for forming the body contact region (the step shown in FIG. 10C and FIG. 10D in the first embodiment) and the first conductivity type impurity (e.g., N-type phosphorus) 1450 is implanted to the surface portion of the semiconductor layer 110 of the first region 11, using the resist pattern 1400 covering the semiconductor layer 110 of the second region 12 as a mask. Thus, the first conductivity type (e.g., N$^+$-type) source region 113A is formed in the surface portion of the semiconductor layer 110 of the first region 11, namely, over the body region 112 of the first region 11.

Figure 12A:
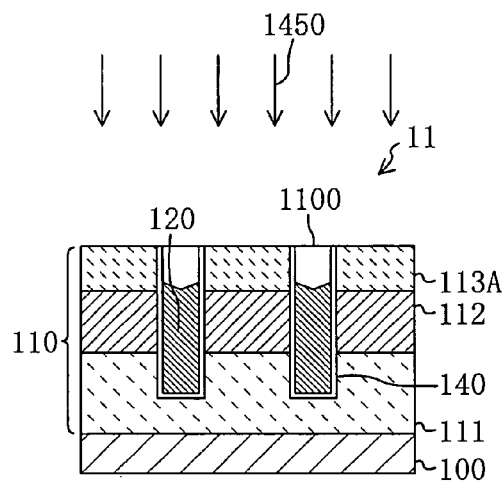
Figure 12B:
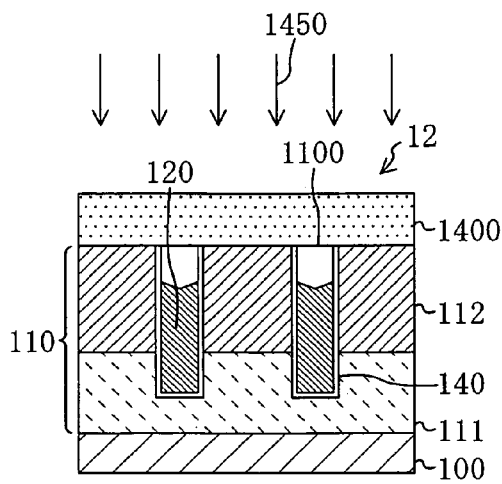
Figure 12C:
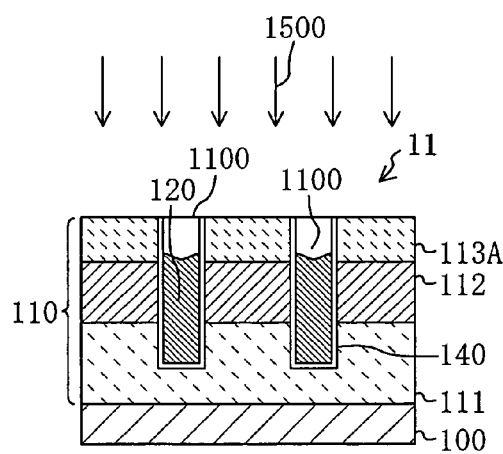
Figure 12D:
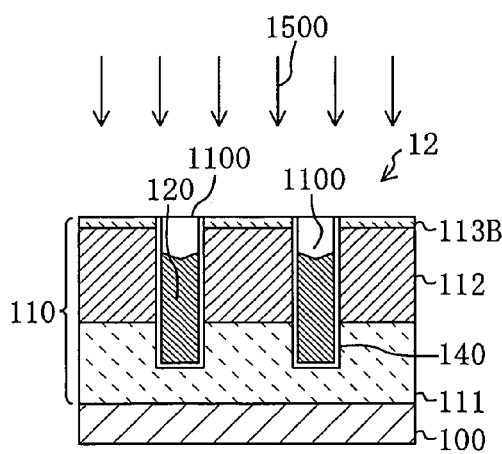

Next, after removing the resist pattern 1400, the first conductivity type impurity (e.g., N-type phosphorus) 1500 is implanted to the entirety of the surface portion of the semiconductor layer 110, as shown in FIG. 12C and FIG. 12D. Thus, the first conductivity type (e.g., N$^+$-type) source region 113B is formed in the surface portion of the semiconductor layer 110 of the second region 12, namely, over the body region 112 of the second region 12. It is noted that the source region 113B of the second region 12 is smaller in thickness than the thickness of the source region 113A of the first region 11. Also, in the present embodiment, the source region 113B is formed so as to cover the entirety of the body region 112 of the second region 12.

Figure 12E:
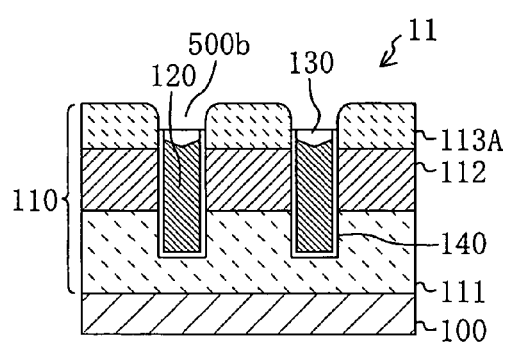
Figure 12F:
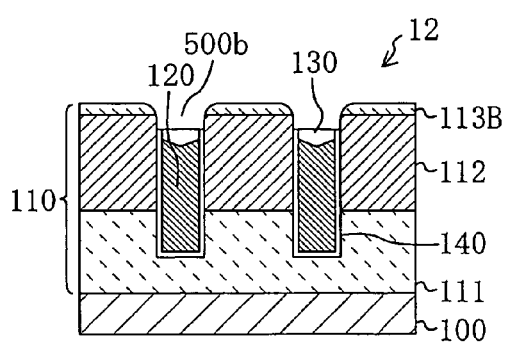

Next, as shown in FIG. 12E and FIG. 12F, respective parts of the silicon oxide film 1100 and the insulating material 140 on the vertical gate electrode 120 in each trench 500 are removed by dry etching, for example, so that the recessed part 500b is formed above the vertical gate electrode 120 in each trench 500 and the source regions 113A, 113B exposed at the upper edge (upper end) of the recessed part 500b are rounded. The conditions of this dry etching are adjusted so that the selection ratio of silicon to the silicon oxide film 1100 is in the range between 2 and 5, both inclusive, thereby rounding efficiently the source regions 113A, 113B exposed at the upper edge of the recessed part 500b.

It is noted that the etching to the silicon oxide film 1100 and the insulating material 140 on the vertical gate electrode 120 shown in FIG. 12E and FIG. 12F is performed so as to expose the source region 113A at the wall face of the recessed part 500b of the first region 11 and so as to expose the body region 112 and the source region 113B at the wall face of the recessed part 500b of the second region 12. In detail, the dry etching to the silicon oxide film 1100 and the insulating material 140 in each trench 500 is performed to etch them down to about 100 to 300 nm, for example, from the surface of the semiconductor layer 110. This dry etching is stopped before the silicon oxide film 1100 on the vertical gate electrode 120 is thoroughly removed with the buried insulating film 130 left on the vertical gate electrode 120. This buried insulating film 130 electrically insulates the vertical gate electrode 120 from the common electrode 170 (shown in FIG. 13A and FIG. 13B).

Then, as shown in FIG. 13A and FIG. 13B, after the barrier metal film 160 and the conductive film (e.g., aluminum film) 150 for wiring are sequentially deposited on the surface of the semiconductor layer 110 including a part on the buried insulating film 130 in the recessed part 500b, the aluminum film 150 and the barrier metal film 160 are patterned to form the common electrode 170. Thus, the source region 113A and the common electrode 170 are electrically connected to each other at the wall face of the recessed part 500b of the first region 11. Also, the body region 112 and the source region 113B are electrically connected to the common electrode 170 through the wall face of the recessed part 500b of the second region 12. Hence, the source region 113B and the body region 112 are surely connected in common to the electrode 170 at the wall face of each gate trench 500 of the second region 12.

According to the second embodiment as described above, in addition to the same effects as in the first embodiment obtainable, the fabrication process can be simplified because the step of forming the body contact region is unnecessary.

While the first and second embodiments refer to a N-channel vertical trench gate DMOS transistor as a vertical trench gate transistor semiconductor device, the vertical trench gate transistor semiconductor device may be, of course, a P-channel vertical trench gate DMOS transistor. In the case of a P-channel vertical trench gate DMOS transistor, the first conductivity type and the second conductivity type are P-type and N-type in the above description, respectively, and the source region, the drain region, and the semiconductor substrate shall be P-type and the body region and the body contact region shall be N-type.

In the first or second embodiment, the thickness of the source region 113B of the second region 12 is set smaller than the thickness of the source region 113A of the first region 11. Instead, by setting, for example, the depth of each trench 500 in the first region 11 to be different from the depth of each trench 500 in the second region 12 (wherein, the body region 112 or the body contact region 114 must be exposed at the wall face of each trench in the second region 12), the thickness of the source region 113A may be set equal to the thickness of the source region 113B.

In the first or second embodiment, the source region 113B is formed over the entirety of the body region 112 or the body contact region 114 of the second region 12. Instead, the source region 113B may be formed so as to partially cover the surface (upper face) of the body region 112 or of the body contact region 114. In this case, in addition to electrical contact of the body region 112 or the body contact region 114 with the common electrode 170 through the wall face of each trench 500 (precisely, the recessed part 500b) in the second region 12, the surface (to be the semiconductor layer 110 of the second region 12) of a part where the source region 113B is not formed in the body region 112 or the body contact region 114 may be in electrical contact with the common electrode 170.

Figure 14A:
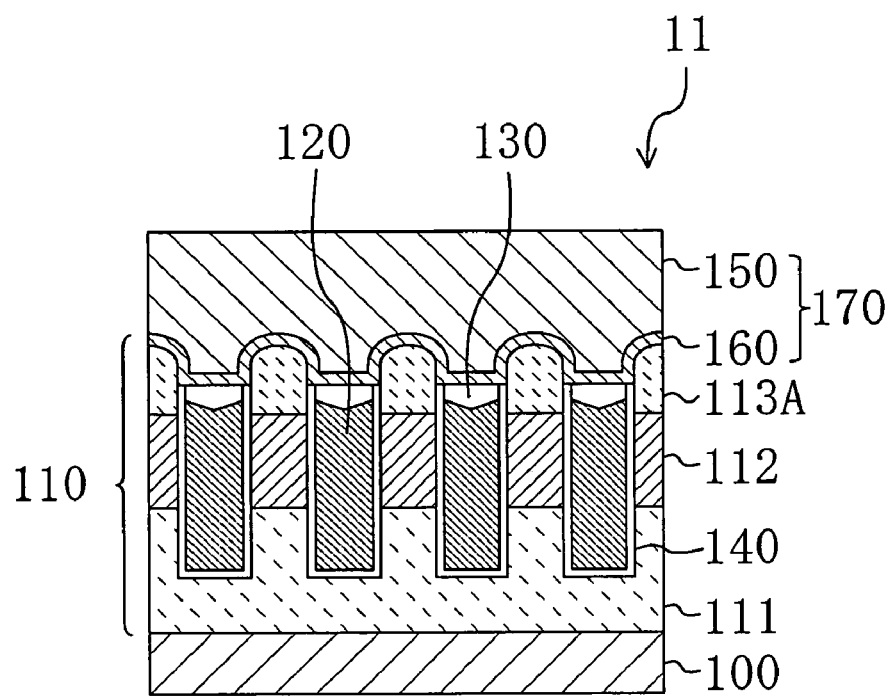
FIG. 14A and FIG. 14B are sections showing a construction of a vertical trench gate transistor semiconductor device in which trench intervals are shortened.
Figure 14B:
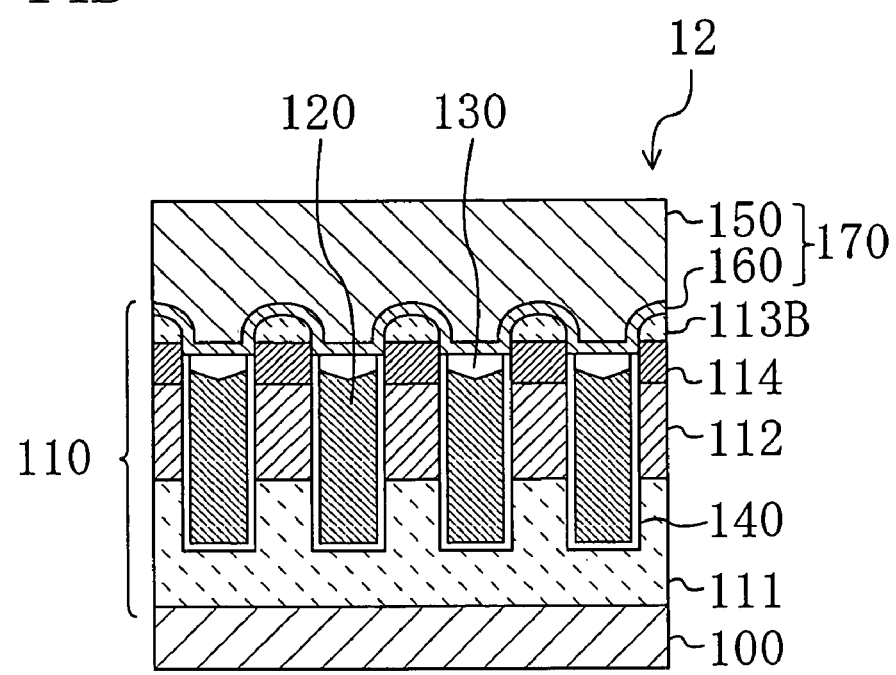

In both of the first and second embodiments, the width of each trench in which the gate electrode 120 is buried and the trench intervals are set to 0.25 μm and the depth of the trenches is set to 1.25 μm. However, the trench MOS in each embodiment is suitable for application to a microstructure, and therefore, it is possible to set the width of each trench and trench intervals to 0.3 μm or less and to set the aspect ratio of the trenches to 3 or more by setting the depth of the trenches to 0.9 μm or larger. For this miniaturization of the width or the like of the trenches, the number of the trenches preferable to be set to 400 or more. FIG. 4A and FIG. 14B are sections showing the construction of a vertical trench gate transistor semiconductor device in which the trench intervals are shortened. In a vertical trench gate transistor semiconductor device in which the trench intervals are shortened, FIG. 14A is a section of the first region taken along a line corresponding to the line a-a' in FIG. 3 while FIG. 14B is a section of the second region 12 taken along a line corresponding to the line b-b' in FIG. 3. In the constructions shown in FIG. 14A and FIG. 14B, the trench intervals is reduced to 0.2 μm, for example. With the narrowed trench intervals, the upper part of the semiconductor layer (the source regions 113A, 113B) interposed by respective two trenches is rounded entirely.

Further, in the first or second embodiment, as shown in FIG. 15A, a N/P/N Zener diode 200 of, for example, polysilicon, which is formed on the upper part of a Si epitaxial substrate 100 with being insulated by a Si oxide film 210, may be formed in the vicinity of the transistor part composed by forming the plural trenches of the N-channel vertical trench gate DMOS transistor of each embodiment. Herein, FIG. 15A is the section of the vertical trench gate transistor semiconductor device and shows, in addition to the transistor part shown in, for example, FIG. 3, a part beside it in the transverse direction thereof (a direction intersecting at right angle with a direction along which the gate extends). Further, as shown in FIG. 15B, the Zener diode 200 is connected, as a diode for protection, between the gate electrode and the source electrode of the N-channel vertical trench gate DMOS transistor, thereby increasing the electrostatic breaking strength.

Wherein, the actual number of the trenches in which the gate electrodes 120 are buried is about 1500. Further, as shown in FIG. 15A, the Al film (precisely, a laminated film of the barrier metal film 160 and the aluminum film 150) is formed on the transistor part as the common electrode 170. The common electrode 170 is connected to the source region 113, which is the semiconductor layer made of N-type polysilicon. The source region 113 is in contact with the body region 112, which is the semiconductor layer made of P-type polysilicon. The body region 112 is in contact with the drain region 111, which is the semiconductor layer made of N-type polysilicon. Also, the drain region 111 is electrically connected to the drain electrode. On the other hand, each N-type semiconductor region of the Zener diode 200 is electrically connected to the common electrode 170 through a contact hole formed in an interlayer insulating film 220 on the Zener diode 200.

In addition, the Zener diode 200 made of polysilicon can be formed in such a manner that non-doped polysilicon is formed simultaneously with the formation of the gate electrode 120 and an impurity is implanted to a predetermined region made of the polysilicon.

What is claimed is:

1. A vertical trench gate transistor semiconductor device comprising:
   a drain region;
   a first body region formed over the drain region;
   a second body region formed over a part of the first body region;
   a first source region formed over another part of the first body region;
   a second source region formed over the second body region and electrically connected to the first source region;
   a trench formed through the first source region, the second source region, the first body region, and the second body region; and
   a gate disposed in the trench;

wherein the second source region functions as an electrical contact for the first source region while the second body region functions as an electrical contact for the first body region, and an upper edge of a wall face of the trench is rounded.

2. The vertical trench gate transistor semiconductor device of claim 1, wherein the first source region and the second source region are exposed at the upper edge of the wall face of the trench, and the first source region and the second source region which are exposed at the upper edge of the wall face of the trench are rounded.

3. The vertical trench gate transistor semiconductor device of claim 1, wherein parts of the wall face of the trench from the upper edge to upper faces of the first source region and the second source region are rounded entirely.

4. The vertical trench gate transistor semiconductor device of claim 1, wherein a thickness of the second source region is smaller than a thickness of the first source region.

5. The vertical trench gate transistor semiconductor device of claim 1, wherein the second source region covers an entirety of the second body region.

6. The vertical trench gate transistor semiconductor device of claim 1, wherein an impurity concentration of an upper part of the second body region is higher than an impurity concentration of a lower part of the second body region.

7. The vertical trench gate transistor semiconductor device of claim 1, wherein a gate region is formed so as to form a recessed part in an upper part of the trench, and the second body region is exposed at a wall face of the recessed part.

8. The vertical trench gate transistor semiconductor device of claim 1, wherein a gate region is formed so as to form a recessed part in an upper part of the trench, and the first source region and the second source region are exposed at the wall face of the recessed part and are in contact through the respective exposed parts and upper faces of the respective source regions.

9. The vertical trench gate transistor semiconductor device of claim 7, wherein the second body region includes, in an upper portion thereof, a heavily doped region of which impurity concentration is relatively high, and the heavily doped region is exposed at the wall face of the recessed part and is in electrical contact through the exposed part.

10. The vertical trench gate transistor semiconductor device of claim 7, wherein the second source region and the second body region are exposed at the wall face of the recessed part and are in electrical contact through the respective exposed parts.

11. The vertical trench gate transistor semiconductor device of claim 7, further comprising:

an additional electrode overlaid from the second source region to the gate region with an insulating film interposed, wherein the additional electrode is in contact with the second source region and the second body region at the wall face of the recessed part.

12. A vertical trench gate transistor semiconductor device comprising:

a drain region;

a first body region formed over the drain region;

a second body region formed over a part of the first body region;

a first source region formed over another part of the first body region;

a second source region formed over the second body region and electrically connected to the first source region;

a trench formed through the first source region and the first body region; and a gate disposed in the trench;

wherein the second source region functions as an electrical contact for the first source region while the second body region functions as an electrical contact for the first body region, an upper edge of a wall face of the trench is rounded, a gate region is formed so as to form a recessed part in an upper part of the trench, and the second body region is exposed at a wall face of the recessed part and is in electrical contact through the exposed part.

13. The vertical trench gate transistor semiconductor device of claim 12, wherein the first source region and the second source region are exposed at the upper edge of the wall face of the trench, and the first source region and the second source region which are exposed at the upper edge of the wall face of the trench are rounded.

14. The vertical trench gate transistor semiconductor device of claim 12, wherein parts of the wall face of the trench from the upper edge to upper faces of the first source region and the second source region are rounded entirely.

15. The vertical trench gate transistor semiconductor device of claim 14, further comprising:

an additional electrode overlaid from the first source region and the second source region to the gate region with an insulating film interposed, wherein the additional electrode is in contact with the second source region and the second body region at the wall face of the recessed part.

16. The vertical trench gate transistor semiconductor device of claim 15, wherein the additional electrode is electrically connected to the first source region and the second source region.

17. The vertical trench gate transistor semiconductor device of claim 12, wherein the second source region is thinner than the first source region.

18. The vertical trench gate transistor semiconductor device of claim 12, wherein the second body region includes a lower portion and an upper portion whose impurity concentration is higher than an impurity concentration of the lower portion, and the upper portion is exposed at the wall face of the recessed part and is in electrical contact through the exposed part.

19. The vertical trench gate transistor semiconductor device of claim 18, wherein an additional electrode is formed over the gate in the recessed part with an insulating layer interposed, and the additional electrode is in contact with the upper portion at the wall face of the recessed part.

* * * * *

UNITED STATES PATENT AND TRADEMARK OFFICE
CERTIFICATE OF CORRECTION

PATENT NO. : 7,663,182 B2  Page 1 of 1
APPLICATION NO. : 11/297406
DATED : February 16, 2010
INVENTOR(S) : Mizokuchi et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 828 days.

Signed and Sealed this

Thirtieth Day of November, 2010

David J. Kappos
*Director of the United States Patent and Trademark Office*